United States Patent
Jung et al.

(10) Patent No.: US 12,386,393 B2
(45) Date of Patent: Aug. 12, 2025

(54) ELECTRONIC DEVICE COMPRISING ROLLABLE DISPLAY

(71) Applicant: Samsung Electronics Co., Ltd., Suwon-si (KR)

(72) Inventors: Hojin Jung, Suwon-si (KR); Youngmin Ji, Suwon-si (KR); Junhyuk Kim, Suwon-si (KR); Wonho Lee, Suwon-si (KR); Yangwook Kim, Suwon-si (KR); Hyoungtak Cho, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 313 days.

(21) Appl. No.: 18/305,002

(22) Filed: Apr. 21, 2023

(65) Prior Publication Data
US 2023/0266798 A1    Aug. 24, 2023

Related U.S. Application Data

(63) Continuation of application No. PCT/KR2021/014258, filed on Oct. 14, 2021.

(30) Foreign Application Priority Data

Nov. 18, 2020  (KR) .................. 10-2020-0154381
Apr. 14, 2021  (KR) .................. 10-2021-0048725

(51) Int. Cl.
    G06F 1/16    (2006.01)
    H05K 5/02    (2006.01)
(52) U.S. Cl.
    CPC .......... *G06F 1/1652* (2013.01); *H05K 5/0217* (2013.01)

(58) Field of Classification Search
    CPC .... G06F 1/1652; G06F 1/1626; G06F 1/1647; G06F 1/165; G06F 1/1698; G06F 1/1624;
    (Continued)

(56) References Cited

U.S. PATENT DOCUMENTS 9,105,986 B2   8/2015 Mahanfar et al.
9,244,494 B2   1/2016 Hinson
(Continued)

FOREIGN PATENT DOCUMENTS

CN   108538201 A    9/2018
CN   112002235 A   11/2020
(Continued)

OTHER PUBLICATIONS

International Search Report dated Jan. 14, 2022, issued in International Patent Application No. PCT/KR2021/014258.
(Continued)

*Primary Examiner* — Allen L Parker
*Assistant Examiner* — Keon Kim
(74) *Attorney, Agent, or Firm* — Jefferson IP Law, LLP

(57) ABSTRACT

An electronic device is provided. The electronic device includes a rollable display, includes a rotation shaft arranged in an inner space of a housing in a first direction, a first printed circuit board (PCB) coupled to the rotation shaft, a rollable display arranged to be wound in the inner space of the housing, and is drawn out from the inside to the outside of the housing in conjunction with the rotation of the rotation shaft and in a second direction perpendicular to the first direction, a first electrical component which is arranged in the inner space of the housing and between a first flat portion and one end of the rotation shaft, fixed irrespective of the rotation of the rotation shaft, and a first rollable flexible PCB (FPCB) which allows the first PCB and the first electrical component to be electrically connected to each other.

15 Claims, 18 Drawing Sheets

(58) Field of Classification Search
CPC ............... H05K 5/0217; H05K 1/189; H05K 2201/051; H05K 2201/10128; H05K 1/028; H05K 1/147; H04M 1/0277; H04M 1/0237; H04M 1/0268
See application file for complete search history.

(56) References Cited

U.S. PATENT DOCUMENTS

| | | | |
|---|---|---|---|
| 9,760,129 B2* | 9/2017 | Kim | G06F 1/1652 |
| 9,823,700 B2 | 11/2017 | Lee et al. | |
| 10,254,797 B2* | 4/2019 | Lee | G06F 1/1658 |
| 10,547,718 B2 | 1/2020 | Lee | |
| 2004/0095073 A1 | 5/2004 | Lee et al. | |
| 2013/0161380 A1 | 6/2013 | Joyce et al. | |
| 2014/0362512 A1* | 12/2014 | Hinson | G06F 1/1601 |
| | | | 361/679.21 |
| 2016/0029474 A1 | 1/2016 | Cho et al. | |
| 2016/0054758 A1* | 2/2016 | Han | G06F 1/1652 |
| | | | 361/679.26 |
| 2016/0324021 A1* | 11/2016 | Takayanagi | G06F 1/1652 |
| 2017/0196102 A1 | 7/2017 | Shin et al. | |
| 2017/0212607 A1* | 7/2017 | Yoon | G06F 3/147 |
| 2018/0210559 A1 | 7/2018 | Xia et al. | |
| 2020/0051468 A1 | 2/2020 | Jung et al. | |
| 2020/0209924 A1 | 7/2020 | Zuo | |
| 2020/0333855 A1 | 10/2020 | Kim et al. | |
| 2022/0317733 A1 | 10/2022 | Li | |

FOREIGN PATENT DOCUMENTS

| | | |
|---|---|---|
| EP | 3675470 A2 | 7/2020 |
| JP | 6329488 B2 | 5/2018 |
| KR | 10-2003-0055418 A | 7/2003 |
| KR | 10-2004-0043960 A | 5/2004 |
| KR | 10-2017-0081347 A | 7/2017 |
| KR | 10-2017-0089664 A | 8/2017 |
| KR | 10-1773443 B1 | 9/2017 |
| KR | 10-2018-0048844 A | 5/2018 |
| KR | 10-2020-0018282 A | 2/2020 |
| KR | 10-2020-0054674 A | 5/2020 |
| KR | 10-2127403 B1 | 6/2020 |
| WO | 2016/175431 A1 | 11/2016 |

OTHER PUBLICATIONS

Extended European Search Report dated Mar. 5, 2024, issued in European Patent Application No. 21894893.3-1224.

* cited by examiner

ELECTRONIC DEVICE COMPRISING ROLLABLE DISPLAY

CROSS-REFERENCE TO RELATED APPLICATION(S)

This application is a continuation application, claiming priority under § 365 (c), of an International application No. PCT/KR2021/014258, filed on Oct. 14, 2021, which is based on and claims the benefit of a Korean patent application number 10-2020-0154381, filed on Nov. 18, 2020, in the Korean Intellectual Property Office, and of a Korean patent application number 10-2021-0048725, filed on Apr. 14, 2021, in the Korean Intellectual Property Office, the disclosure of each of which is incorporated by reference herein in its entirety.

BACKGROUND

1. Field

The disclosure relates to an electronic device including a rollable display.

2. Description of Related Art

With the development of display technology, research and development of electronic devices having a rollable display (or a flexible display) are being actively conducted.

Electronic devices are being gradually transformed from a uniform rectangular shape into various shapes. For example, electronic devices are being researched and developed to have a form factor in which a display is capable of being folded, bent, rolled, or unfolded by applying a rollable display to the electronic devices.

The above information is presented as background information only to assist with an understanding of the disclosure. No determination has been made, and no assertion is made, as to whether any of the above might be applicable as prior art with regard to the disclosure.

SUMMARY

An electronic device may be designed to include, as a novel form factor, a hollow housing such that a rollable display is rolled inside the hollow housing. Such an electronic device may be designed such that the rollable display is drawn out from the inside to the outside of the hollow housing based on a predetermined event. In an electronic device including a rollable display, since at least a portion of the radiation area of an antenna is covered by the display, there may be difficulties in securing the performance of the antenna. Since most of the housing is covered by the display, a space for placing an antenna for cellular communication or short-range communication may be insufficient.

Aspects of the disclosure are to address at least the above-mentioned problems and/or disadvantages and to provide at least the advantages described below. Accordingly, an aspect of the disclosure is to provide an electronic device including a hollow housing and a rollable display configured to be pushed out from inside the hollow housing, wherein an antenna radiator for cellular communication or short-range communication (e.g., Wi-Fi) is configured by using at least a portion of the housing.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first flat portion disposed at one end of the housing and a second flat portion disposed at the other end of the housing in parallel to the first flat portion, wherein each of the first flat portion and the second flat portion includes at least one conductive portion and at least one non-conductive portion, a rotary shaft disposed in a first direction in an inner space of the housing, a first printed circuit board (PCB) coupled to the rotary shaft and configured to rotate following rotation of the rotary shaft, a rollable display arranged to be rolled in the inner space of the housing and pushed out from inside to outside of the housing in interlocking with the rotation of the rotary shaft in a second direction perpendicular to the first direction, a first electrical component disposed between the first flat portion and one end of the rotary shaft in the inner space of the housing and fixed regardless of the rotation of the rotary shaft, wherein the first electrical component is operably connected to the at least one conductive portion of the first flat portion via a first connecting member, and a first rollable flexible printed circuit board (FPCB) electrically connecting the first PCB and the first electrical component to each other, wherein the first rollable FPCB is spirally rolled around the one end of the rotary shaft.

Various embodiments of the disclosure provide an electronic device having a novel form factor and including a hollow housing and a rollable display designed to be pushed out from the inside of the housing, wherein an antenna radiator for cellular communication or short-range communication (e.g., Wi-Fi) is configured by using at least a portion of the housing. As a result, it is possible to secure a space for arranging antennas.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
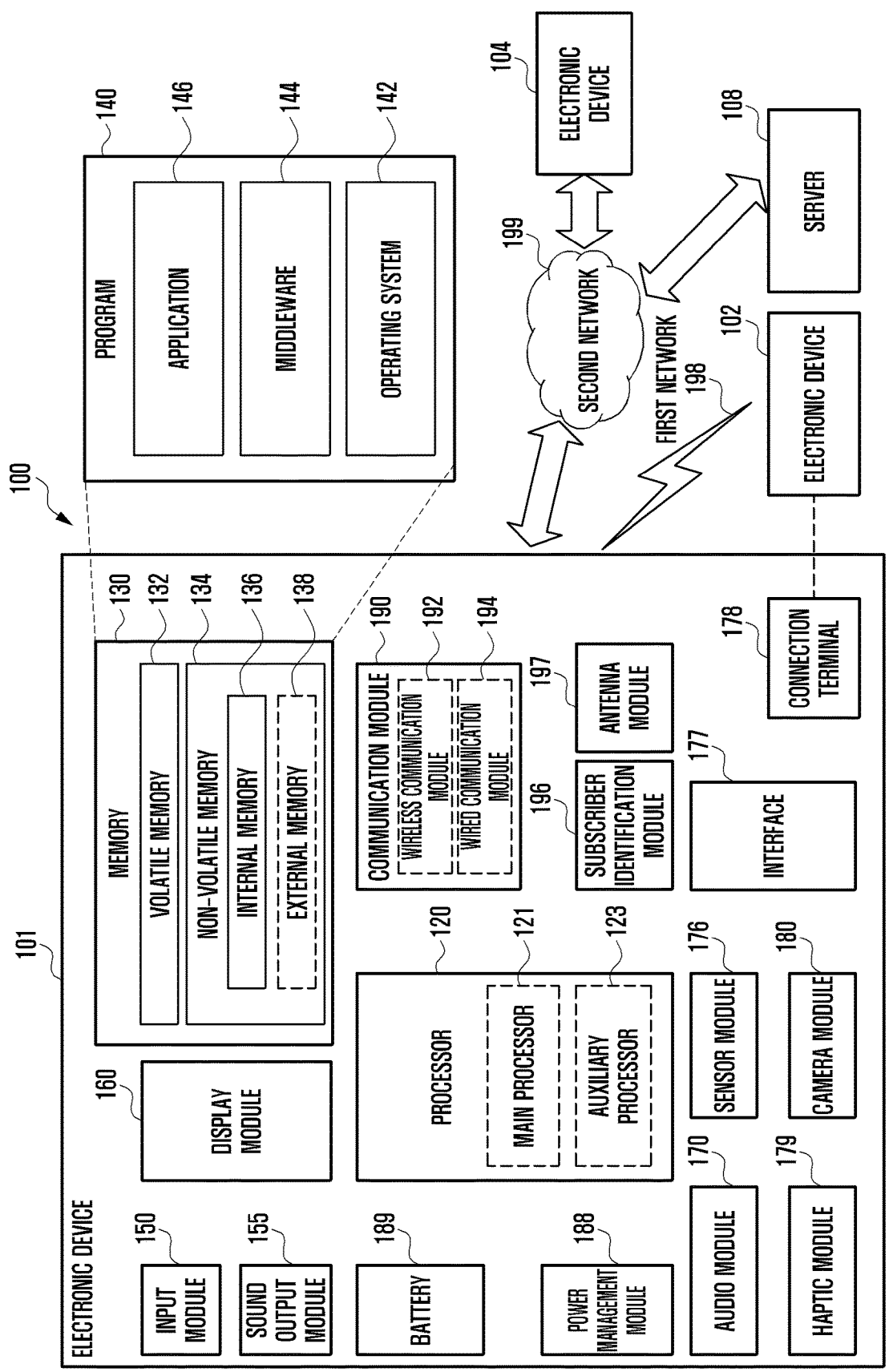
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning.

Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth-generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a fourth-generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. The electronic devices according to embodiments of the disclosure are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., module or program) of the above-described components may include a singular or a plurality of entities, and some of the plurality of entities may be separately disposed in any other component. According to various embodiments of the disclosure, one or more components or operations among the above-described components may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration. According to various embodiments of the disclosure, operations performed by a module, program, or other component may be executed sequentially, in parallel, repeatedly, or heuristically, or one or more of the operations may be executed in a different order or omitted, or one or more other operations may be added.

Figure 6:
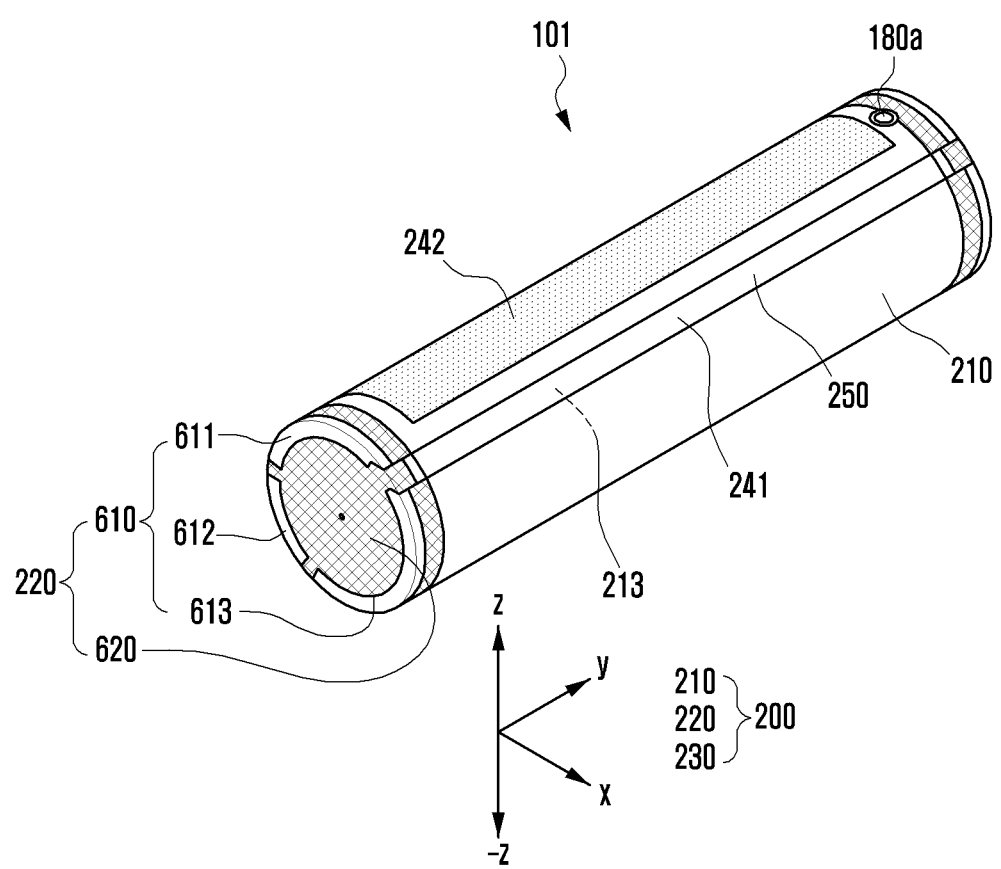
FIG. 6 is a front perspective view illustrating an electronic device in a first state according to an embodiment of the disclosure.

According to various embodiments of the disclosure, an electronic device (e.g., the electronic device 101 of FIG. 1) may include a housing (e.g., a housing 200 in FIG. 2) including a first flat portion (e.g., a first flat portion 220 in FIG. 2) disposed at one end of the housing 200, and a second flat portion (e.g., a second flat portion 230 in FIG. 2) disposed at the other end of the housing 200 and disposed in parallel to the first flat portion 220, wherein each of the first flat portion 220 and the second flat portion 230 includes at least one conductive portion (e.g., a first conductive portion 611, a second conductive portion 612, and/or the third conductive portion 613 in FIG. 6) and at least one non-conductive portion (e.g., a non-conductive portion 620 in FIG. 6), a rotary shaft 811 disposed in a first direction in the inner space 801 of the housing 200, a first PCB 821 coupled to the rotary shaft 811 and configured to rotate following the rotation of the rotary shaft 811, a rollable display 241, also referred to as a first display 241, arranged to be rolled in the inner space 801 of the housing 200 and pushed out from inside to outside of the housing 200 in interlocking with the rotation of the rotary shaft 811 in a second direction perpendicular to the first direction, a first electrical component 822 (e.g., a second PCB 822 in FIG. 8A) disposed between the first flat portion 220 and one end of the rotary shaft 811 in the inner space 801 of the housing 200 and fixed regardless of the rotation of the rotary shaft 811, wherein the first electrical component 822 is operably connected to the conductive portion (e.g., the first conductive portion 611, the second conductive portion 612, and/or the third conductive portion 613 in FIG. 6) of the first flat portion 220 via a first connecting member 911, and a first rollable FPCB 831 electrically connecting the first PCB 821 and the first electrical component to each other, wherein the first rollable FPCB 831 is spirally rolled around the one end of the rotary shaft 811.

According to an embodiment of the disclosure, one end of the first rollable FPCB 831 may be disposed adjacent to the one end of the rotary shaft 811 and may be electrically connected to a portion of the first PCB 821, and the other end of the first rollable FPCB 831 may be electrically connected to a portion of the first electrical component 822.

According to an embodiment of the disclosure, the first electrical component 822 may include a circular first opening 1011 in the center thereof, and the first rollable FPCB 831 may have a diameter smaller than or equal to that of the first opening 1011.

According to an embodiment of the disclosure, a first shield member may be disposed between the first rollable FPCB 831 and the first PCB 821, and the first rollable FPCB 831 may be configured to form a radiation pattern in a direction from the first shield member toward the first flat portion 220 by including at least one wire configured to provide a wireless charging function.

According to an embodiment of the disclosure, the conductive portion (e.g., the first conductive portion 611, the second conductive portion 612, and/or the third conductive portion 613 in FIG. 6) may include the first conductive portion 611 used as a first antenna configured to perform wireless communication with a predetermined first frequency, the second conductive portion 612 used as a second antenna configured to perform wireless communication with a predetermined second frequency, and a third conductive portion 613 used as a third antenna configured to perform wireless communication with a predetermined third frequency.

According to an embodiment of the disclosure, the rotary shaft 811 may be attached to one surface of the first PCB 821.

According to an embodiment of the disclosure, the housing 200 may be configured in a hollow shape which includes one of a cylindrical shape and a prismatic shape, and the rollable display 241 may be accommodated in the inner space 801 of the housing 200 in a rolled state.

According to an embodiment of the disclosure, the electronic device may further include a sub-display 242 visually exposed outside through a portion of the housing 200.

According to an embodiment of the disclosure, the electronic device may further include a second electrical component 823 disposed between the second flat portion 230 and the other end of the rotary shaft 811 in the inner space 801 of the housing 200 and fixed regardless of the rotation of the rotary shaft 811, wherein the second electrical component 823 is operably connected to the conductive portion of the second flat portion 230 via a second connecting member, and a second rollable FPCB 832 electrically connecting the first PCB 821 and the second electrical component 823 to each other, wherein the second rollable FPCB 832 is spirally rolled around the other end of the rotary shaft 811.

According to an embodiment of the disclosure, the first electric component 822 may be a second PCB, and the second electric component 823 may be a third PCB.

According to an embodiment of the disclosure, one end of the second rollable FPCB 832 may be disposed adjacent to the other end of the rotary shaft 811 and may be electrically connected to a portion of the first PCB 821, and the other end of the second rollable FPCB 832 may be electrically connected to a portion of the second electrical component 823.

According to an embodiment of the disclosure, the third PCB may include a circular second opening in a center thereof, and the second rollable FPCB 832 may have a diameter smaller than or equal to that of the second opening.

According to an embodiment of the disclosure, a second shield member may be disposed between the second rollable FPCB 832 and the first PCB 821.

According to an embodiment of the disclosure, the second rollable FPCB 832 may be configured to form a radiation pattern in a direction from the second shield member toward the second flat portion 230 by including at least one wire configured to provide a wireless charging function.

According to an embodiment of the disclosure, the electronic device may further include a plurality of guide wheels spirally disposed along a surface of the first rollable PCB at intervals, and each of the plurality of guide wheels may include a wheel member that comes into contact with the surface of the first rollable PCB and a guide shaft 811 penetrating the wheel member.

According to an embodiment of the disclosure, the electronic device may further include a plurality of rail members configured to guide movement of the plurality of guide wheels, and the plurality of rail members are provided to be directed to the center of the rotary shaft 811 to enable the plurality of guide wheels to reciprocate toward the center of the rotary shaft 811.

According to an embodiment of the disclosure, the plurality of rail members (e.g., rail members 1120 in FIG. 11A) may include at least one first rail member (e.g., a first rail member 1121 in FIG. 11B) provided on the first flat portion 220, and a second rail member (e.g., a second rail member 1122 in FIG. 11B) provided on the first shield member disposed between the first rollable FPCB 831 and the first PCB 821.

According to an embodiment of the disclosure, the conductive portion may include the first conductive portion 611, the second conductive portion 612, and a third conductive portion 613 disposed at intervals along the outer edge of the first flat portion 220 to be split by the non-conductive portion.

According to an embodiment of the disclosure, the first conductive portion 611 may be configured to operate as a first antenna by including a first feeding point (e.g., a first feeding point 941-1 in FIG. 9) electrically connected to a feeding portion of the first electrical component 822 and a first ground point (e.g., a first ground point 942-1 in FIG. 9) electrically connected to a ground, the second conductive portion 612 may be configured to operate as a second antenna by including a second feeding point (e.g., a second feeding point 941-2 in FIG. 9) electrically connected to the feeding portion of the first electrical component 822 and a second ground point (e.g., a second ground point 942-2) electrically connected to the ground, and the third conductive portion 613 may be configured to operate as a third antenna by including a third feeding point (e.g., a third feeding point 941-3 in FIG. 9) electrically connected to the feeding portion of the first electrical component 822 and a switch portion electrically connected to a switch of the first electrical component 822.

According to an embodiment of the disclosure, the first conductive portion 611 to the third conductive portion 613 may at least partially include extensions (e.g., the extensions 611*b*, 612*b*, and 613*b* of FIG. 14) extending toward the rotary shaft 811.

Figure 2:
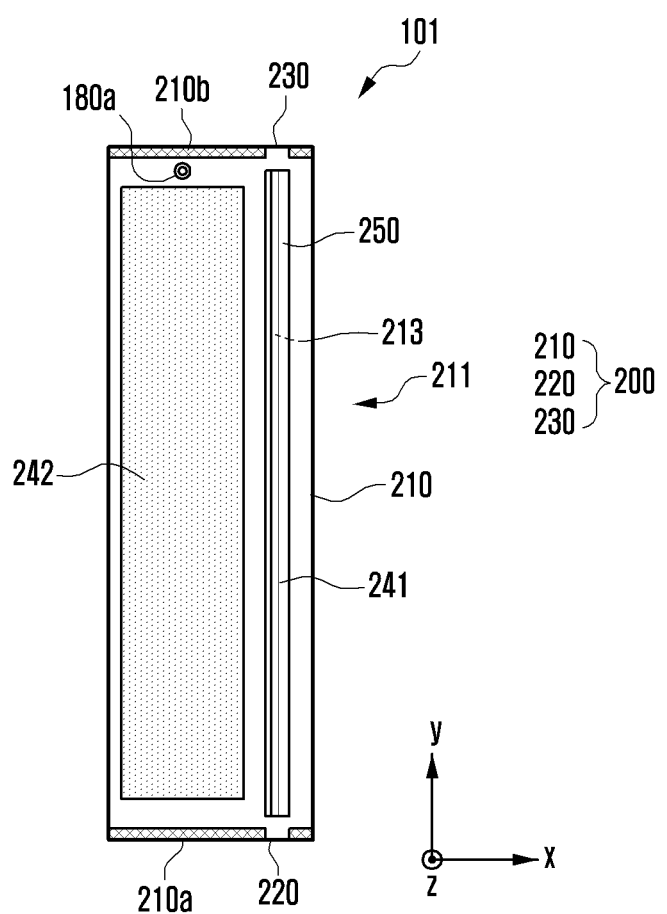
FIG. 2 is a front view illustrating an electronic device in a first state (e.g., a slide-in state) according to an embodiment of the disclosure.

FIG. 2 is a front view of an electronic device in a first state (e.g., a slide-in state) according to an embodiment of the disclosure.

Figure 3:
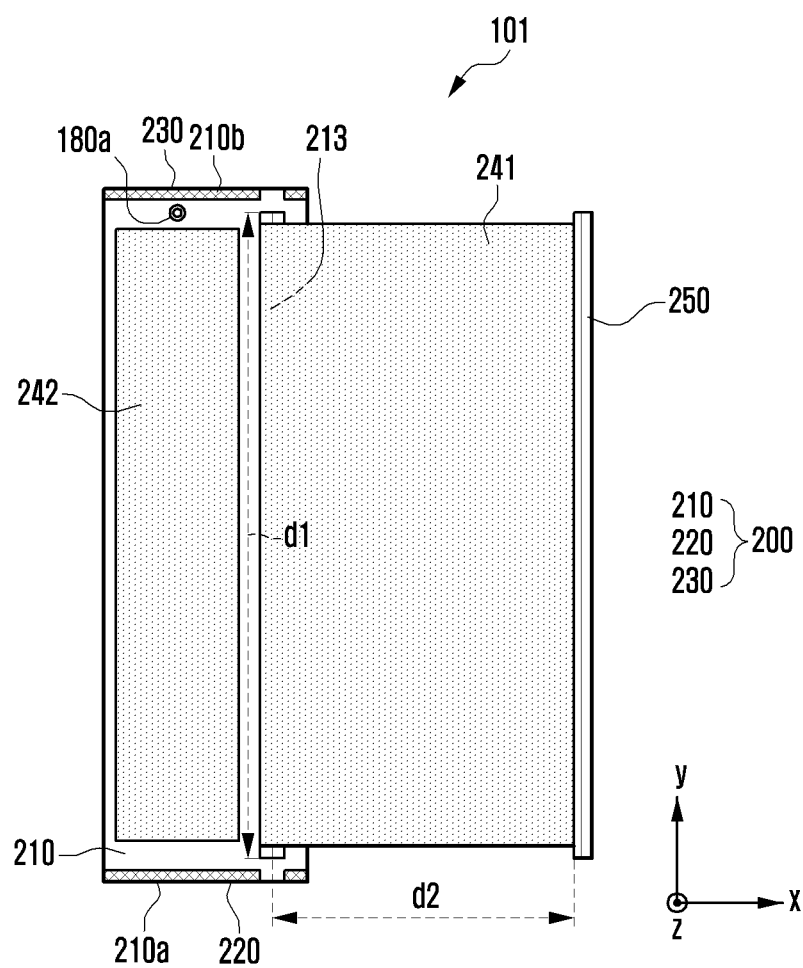
FIG. 3 is a front view illustrating an electronic device in the second state (e.g., a slide-out state) according to an embodiment of the disclosure.

FIG. 3 is a front view of an electronic device in the second state (e.g., a slide-out state) according to an embodiment of the disclosure.

Figure 4:
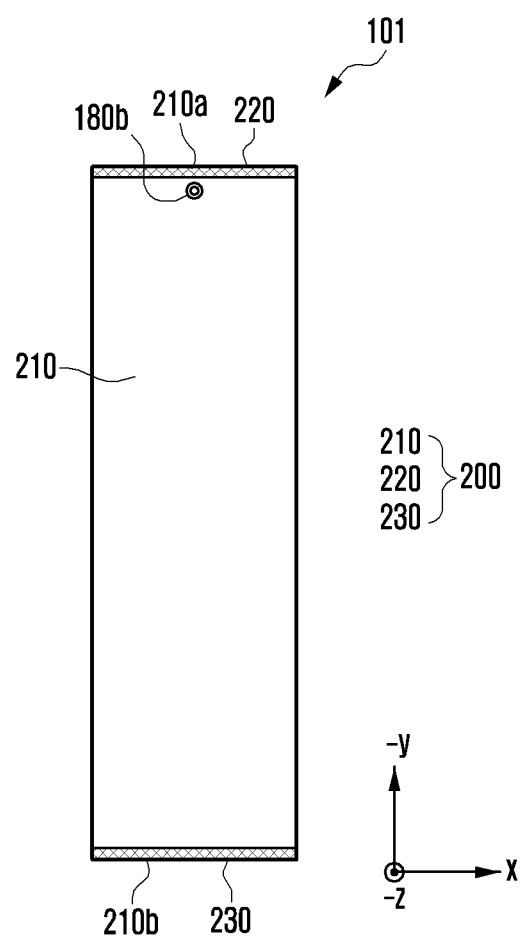
FIG. 4 is a rear view illustrating an electronic device in a first state according to an embodiment of the disclosure.

FIG. 4 is a rear view of an electronic device in a first state according to an embodiment of the disclosure.

Figure 5:
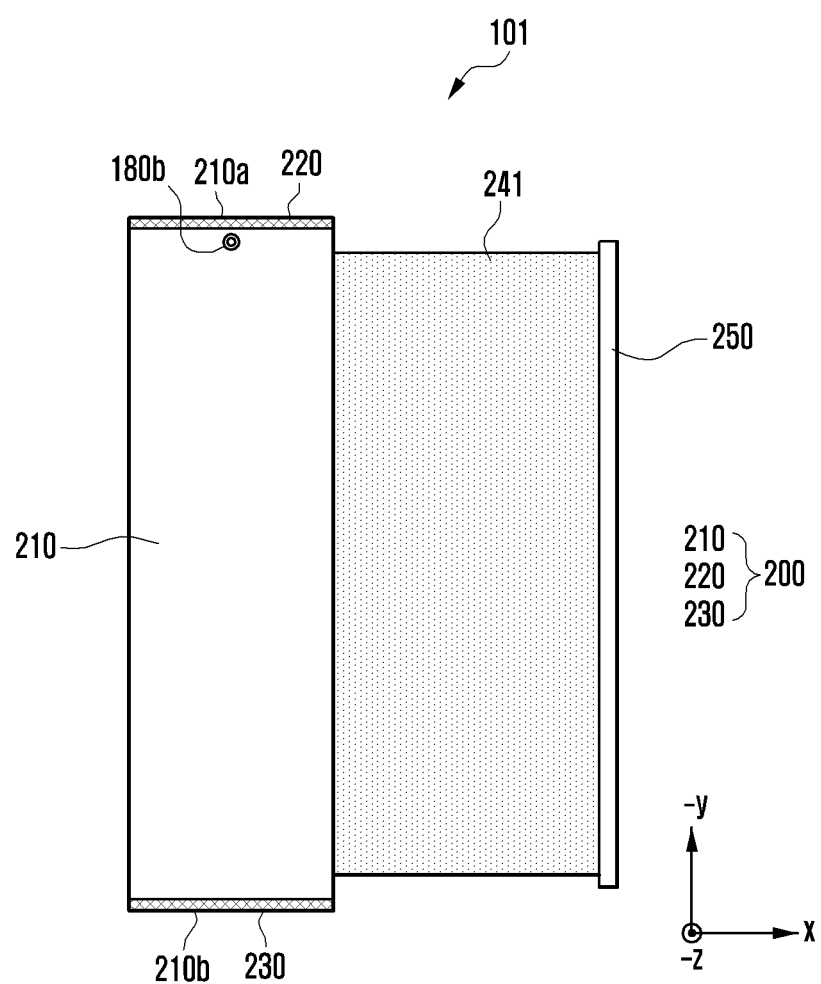
FIG. 5 is a rear view illustrating an electronic device in a second state according to an embodiment of the disclosure.

FIG. 5 is a rear view of an electronic device in a second state according to an embodiment of the disclosure.

Referring to FIGS. 2 to 5, the electronic device according to various embodiments may include a hollow housing 200 according to an embodiment of the disclosure.

According to an embodiment of the disclosure, the hollow housing 200 may include a main body 210 having a hollow (e.g., the space 801 in FIG. 8A) and having a predetermined length, the first flat portion 220 disposed at one end 210*a* of the main body 210 to be coupled to the main body 210 or configured integrally with the main body 210, and a second flat portion 230 disposed at the other end 210*b* of the main body 210 to be coupled to the main body 210 or configured integrally with the main body 210. According to an embodiment of the disclosure, the main body 210 may have a cylindrical shape, but at least a portion of its surface may have a flat surface without curvature. In an embodiment of the disclosure, the first flat portion 220 may be provided based on the shape of the one end 210a of the main body 210. For example, when the one end 210a of the main body 210 has a circular shape, the first flat portion 220 may have a circular shape corresponding to the one end 210a. As another example, the second flat portion 230 may be provided based on the shape of the other end 210b of the main body 210. For example, when the other end 210b of the main body 210 has a circular shape, the second flat portion 230 may have a circular shape corresponding to the other end 210b.

The hollow mentioned herein may include a cylindrical shape, a prismatic, a square pillar shape, a triangular prismatic shape, or the like.

According to an embodiment of the disclosure, the first flat portion 220 may extend from the one end 210a of the main body 210. According to an embodiment of the disclosure, the second flat portion may extend from the other end 210b of the main body 210. According to an embodiment of the disclosure, the first flat portion 220 and the second flat portion 230 may be disposed to be substantially parallel to each other. According to an embodiment of the disclosure, the main body 210 may be disposed between the first flat portion 220 and the second flat portion 230, thereby substantially defining side surface portions 211 of the electronic device 101. For example, the main body 210 may define the side surface portions 211 of the electronic device 101 each of which includes a curved surface. According to various embodiments of the disclosure, the curvature of the main body 210 or the diameter of the main body 210 may be variously designed and modified. Although not illustrated, the main body 210 may have a substantially cylindrical shape, but may at least partially include a flat plane.

According to an embodiment of the disclosure, the electronic device 101 may include a second display 242 exposed outside through at least a portion of the main body 210 of the housing 200. According to an embodiment of the disclosure, the second display 242 may be always visually exposed outside regardless of whether the electronic device 101 is in a first state or in a second state. For example, the second display 242 may be always visually exposed outside by being exposed outside through at least a portion of the surface of the main body 210.

According to an embodiment of the disclosure, the second display 242 may be disposed in a recess (not illustrated) provided on at least a portion of the surface of the main body 210 to occupy a portion of the area of the main body 210. According to an embodiment of the disclosure, since the surface of the main body 210 has a curved surface, the second display 242 may include a curved surface having a similar curvature to that of the surface of the main body 210. In some embodiments of the disclosure, the second display 242 may have a flat shape, in which case, a flat support surface (not illustrated) may be provided on the surface of the main body 210 to support the second display 242.

According to an embodiment of the disclosure, camera modules 180a and 180b (e.g., the camera module of FIG. 1) may be disposed in the main body 210 of the housing 200. According to an embodiment of the disclosure, the camera modules 180a and 180b may include a first camera module 180a arranged to face the front side of the electronic device 101 (e.g., the z direction) where the second display 242 is visually exposed and a second camera module 180b disposed to face the rear side of the electronic device 101 (e.g., the −z direction) arranged to a direction opposite to the front side. According to some embodiments of the disclosure, one of the first camera module 180a and the second camera module 180b may be omitted.

According to an embodiment of the disclosure, the camera modules 180a and 180b may include one lens or two or more lenses (e.g., a wide-angle lens, an ultra-wide-angle lens, or a telephoto lens) and image sensors. In some embodiments of the disclosure, the camera modules may include a LiDAR sensor, a time-of-flight (TOF) lens, and/or image sensor.

According to various embodiments of the disclosure, the first camera module 180a arranged to face the front side (e.g., the z-direction) of the electronic device 101 through which the second display 242 is visually exposed may be arranged in the inner space of the electronic device 101 to be in contact with the external environment through an opening perforated through the second display 242 or a transmission area. According to an embodiment of the disclosure, the area of the second display 242 that faces the first camera module 305 may be configured with a portion of a content display area as the transmission area having a predetermined transmittance. According to an embodiment of the disclosure, the transmission area may have a transmittance ranging from about 5% to about 20%. The transmission area may include an area overlapping an effective area (e.g., a field of view (FOV)) of the camera module through which light captured by an image sensor to generate an image passes. For example, the transmission area of the second display 242 may include an area having a lower pixel density and/or a lower wiring density than the surrounding area. For example, the first camera module 180a may include an under-display camera (UDC).

According to an embodiment of the disclosure, the main body 210 of the housing 200 may include a slit-shaped hole 213 through which the first display 241 is pushed out from the inner space (e.g., the space 801 of FIG. 8A) of the housing 200. According to an embodiment of the disclosure, the slit-shaped hole 213 may extend in a first direction (e.g., the y direction), which is the length direction of the main body 210, and may have a first length d1. One end of the first display 241 may be connected to a rotary shaft 811 (e.g., the rotary shaft 811 of FIGS. 8A and 8B) disposed in the inner space 801 of the housing 200 and may be slid out from the inner space 801 of the housing 200 in interlocking with the rotation of the rotary shaft 811.

According to an embodiment of the disclosure, in the second state of the electronic device 101, the first display 241 may be pushed out from the main body 210 of the housing 200 by a predetermined second length d2 to a second direction (e.g., the x direction) perpendicular to the first direction (e.g., the y direction). For example, in the second state of the electronic device 101, the area of the display area of the first display 241 may have a horizontal width corresponding to the second length d2 and a vertical width corresponding to the first length d1.

According to an embodiment of the disclosure, the portion of the first display 241 visually seen from outside in the second state of the electronic device 101 may be supported by a display support structure. According to an embodiment of the disclosure, the display support structure may include a bendable member or a bendable support member (not illustrated) (e.g., an articulated hinge module) and/or a handler member 250 coupled to an end of the first display 241 and extending in the first direction (e.g., the y direction).

According to an embodiment of the disclosure, the bendable member may be a component including a plurality of hinge bars (not illustrated) arranged in the first direction (e.g., the y direction) perpendicular to the second direction (e.g., the x direction) where the first display 241 slides. A bendable member according to various embodiments may be referred to as an articulated hinge, a multi-bar assembly, or a hinge bar assembly. According to an embodiment of the disclosure, the bendable member may be at least partially drawn into or pushed out from the inner space 801 of the housing 200 while supporting the first display 241. In some embodiments of the disclosure, the bendable member may be omitted.

According to an embodiment of the disclosure, the handler member 250 may be coupled to an end of the bendable member and disposed in the first direction (e.g., the y direction) which is the length direction of the main body 210. According to an embodiment of the disclosure, the handler member 250 may serve to prevent the first display 241 from being distorted to the z direction or the −z direction in the second state of the electronic device 101. According to an embodiment of the disclosure, the handler member 250 may serve as a handle for a user to hold a portion of the first display 241. According to an embodiment of the disclosure, the handler member 250 may include at least one sensor configured to detect a user's holding or a state (e.g., the posture or direction) of the electronic device 101. According to an embodiment of the disclosure, the handler member 250 may further include an antenna or a substrate (not illustrated).

According to an embodiment of the disclosure, in the first state of the electronic device 101, the first display 241 may slide to a third direction (the −x direction) opposite to the second direction (the x direction) to be slid into the inner space 801 of the housing 200.

According to an embodiment of the disclosure, in the first state of the electronic device 101, at least a portion of the first display 241 may be disposed in a state in which at least a portion of the first display 241 is rolled inside the main body 210 of the housing 200. For example, when the electronic device 101 is switched from the second state to the first state, the first display 241 may be inserted into the inner space 801 of the housing 200 through the slit-shaped hole 213 while moving in the third direction (the −x direction) opposite to the second direction (the x direction). One end of the first display 241 is connected to the rotary shaft 811 disposed in the inner space 801 of the housing 200 and may be introduced into the inner space 801 of the housing 200 in interlocking with the rotation of the rotary shaft 811. According to an embodiment of the disclosure, in the first state, at least a portion of the first display 241 disposed inside the housing 200 may be rolled in a jelly-roll shape.

According to an embodiment of the disclosure, the housing 200 may provide the inner space 801 in which various components (e.g., a printed circuit board, an antenna module (e.g., the antenna module 197 of FIG. 1), a sensor module (e.g., the sensor module 176 of FIG. 1) or a battery (e.g., the battery 189 in FIG. 1) of the electronic device 101 may be arranged. In an embodiment of the disclosure, at least some of the various components of the electronic device 101 arranged in the inner space 801 of the housing 200 may be visually exposed outside through the surface of the main body 210 of the housing 200. According to an embodiment of the disclosure, the components visually exposed outside the main body 210 may include camera modules 180*a* and 180*b* (e.g., the camera module 180 of FIG. 1), a sound output module (not illustrated) (e.g., the sound output module 155 of FIG. 1), and/or sensors. According to an embodiment of the disclosure, the sensors may include at least one of a receiver, a proximity sensor, an ultrasonic sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an indicator. For example, at least some of the components may be disposed under the second display 242 or visually exposed outside through a partial area of the second display 242.

Referring to FIGS. 2 and 3, in various embodiments of the disclosure, the front surface of the electronic device 101 may be defined as a surface on which the second display 242 (e.g., a sub-display) of the electronic device 101 is visually visible from outside. For example, the front surface of the electronic device 101 may be disposed in the z direction which the surface of the second display 242 faces. According to an embodiment of the disclosure, the second display 242 may be visually visible through the front surface of the electronic device 101.

Referring to FIGS. 4 and 5, in various embodiments of the disclosure, the rear surface of the electronic device 101 may be defined as a surface facing a direction opposite to the front surface. For example, the rear surface of the electronic device 101 may face the −z direction opposite to the z direction. According to an embodiment of the disclosure, the second display 242 may be invisible through the rear surface of the electronic device 101.

Referring to FIGS. 2 and 4, in various embodiments of the disclosure, the first state (e.g., the slide-in state) of the electronic device 101 may include a state in which at least a portion of the first display 241 (e.g., a main display) is invisible from outside by being rolled inside the hollow housing 200. For example, the first state may refer to the state in which the externally visible area of the first display 241 is the smallest. In various embodiments of the disclosure, the first state may be referred to as a pulled-in state, a slide-in state, or a contracted state.

Referring to FIGS. 3 and 5, in various embodiments of the disclosure, the second state (e.g., the slide-out state) of the electronic device 101 may include a state in which the first display 241 (e.g., the main display) is visible from outside as the first display 241 is pushed out to the outside of the hollow housing 200. For example, the second state may refer to the state in which the externally visible area of the first display 241 is the largest. In various embodiments of the disclosure, the second state may be referred to as a pushed-out state, a slide-out state, or an extended state.

In an embodiment of the disclosure, the first state may be referred to as a first shape, and the second state may be referred to as a second shape. For example, the first shape may include a normal state, a retracted state, a contracted state, a closed state, or a slide-in state, and the second shape may include an extended state, an open state, or a slide-out state.

According to an embodiment of the disclosure, the electronic device 101 may be in a third state which is a state between the first state and the second state. For example, the third state may be referred to as a third shape, and the third shape may include a free-stop state or an intermediate state. For example, the intermediate state may refer to a state in which an area between the case where the externally visible area of the first display 241 is the smallest and the case where the externally visible area is the largest is visible from outside.

At least one of the components described with reference to FIGS. 2 to 5 may be omitted from the electronic device 101 according to various embodiments or other components may be additionally included in the electronic device 101.

FIG. 6 is a front perspective view illustrating an electronic device in a first state according to an embodiment of the disclosure.

Figure 7:
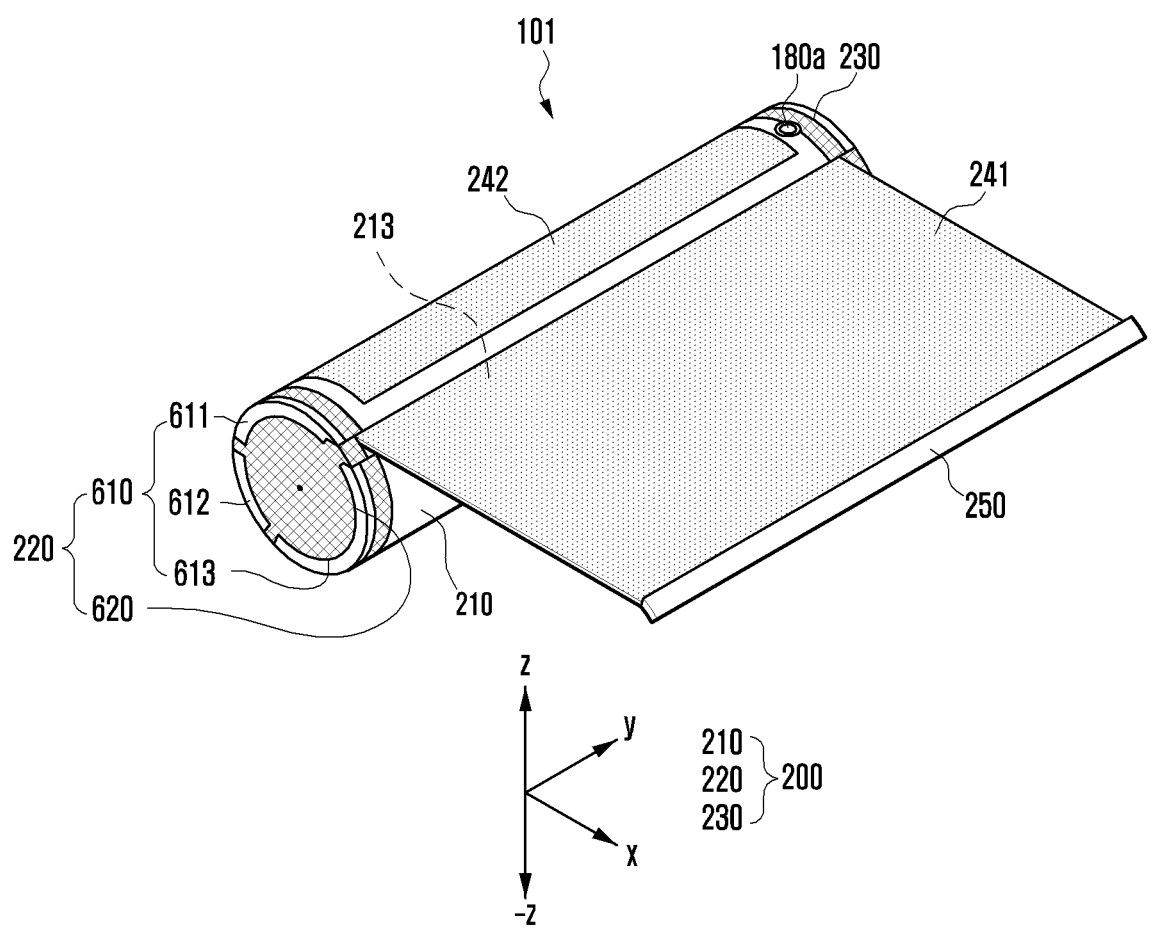
FIG. 7 is a front perspective view illustrating an electronic device in a second state according to an embodiment of the disclosure.

FIG. 7 is a front perspective view illustrating an electronic device in a second state according to an embodiment of the disclosure.

The electronic device 101 illustrated in FIGS. 6 and 7 may include an embodiment that is at least partially similar to or different from the electronic device 101 illustrated in FIGS. 1 to 5. Hereinafter, features of the electronic device 101 that have not been described with reference to FIGS. 1 to 5 or are changed from FIGS. 1 to 5 will be mainly described with reference to FIGS. 6 and 7.

Referring to FIGS. 6 and 7, the first flat portion 220 and/or a second flat portion 230 of the electronic device 101 according to an embodiment may include a conductive portion 610 and/or the non-conductive portion 620.

According to an embodiment of the disclosure, the non-conductive portion 620 disposed on the first flat portion 220 and/or the second flat portion 230 may be an injection-molded product.

According to an embodiment of the disclosure, the conductive portion 610 disposed on the first flat portion 220 and/or the second flat portion 230 may include a metal material, and may be used as an antenna radiator for cellular communication or short-range communication (e.g., Wi-Fi).

According to an embodiment of the disclosure, the conductive portion 610 may include the first conductive portion 611 used as a first antenna, the second conductive portion 612 used as a second antenna, and/or a third conductive portion 613 used as a third antenna.

According to an embodiment of the disclosure, the first conductive portion 611, the second conductive portion 612, and/or the third conductive portion 613 may be split by the non-conductive portion 620.

According to an embodiment of the disclosure, the first antenna may be an antenna configured to perform wireless communication with a predetermined first frequency.

According to an embodiment of the disclosure, the second antenna may be an antenna configured to perform wireless communication with a predetermined second frequency.

According to an embodiment of the disclosure, the third antenna may be an antenna configured to perform wireless communication with a predetermined third frequency.

According to an embodiment of the disclosure, the first frequency may be a communication frequency of Sub-6 (6 GHz or less) band for 5G communication. According to an embodiment of the disclosure, the first frequency may further include a communication frequency for the second generation (2G), third-generation (3G), 4G, or long term evolution (LTE) network.

According to an embodiment of the disclosure, the second frequency may be a communication frequency of a super-high frequency (e.g., mmWave (e.g., the 28-gigahertz (28 GHZ) or 39-gigahertz (39 GHZ)) band for 5G communication.

According to an embodiment of the disclosure, the third frequency may be a communication frequency for the purpose of Bluetooth or Wi-Fi communication in the 2.4-GHz or 5-GHz ISM band.

Figure 8A:
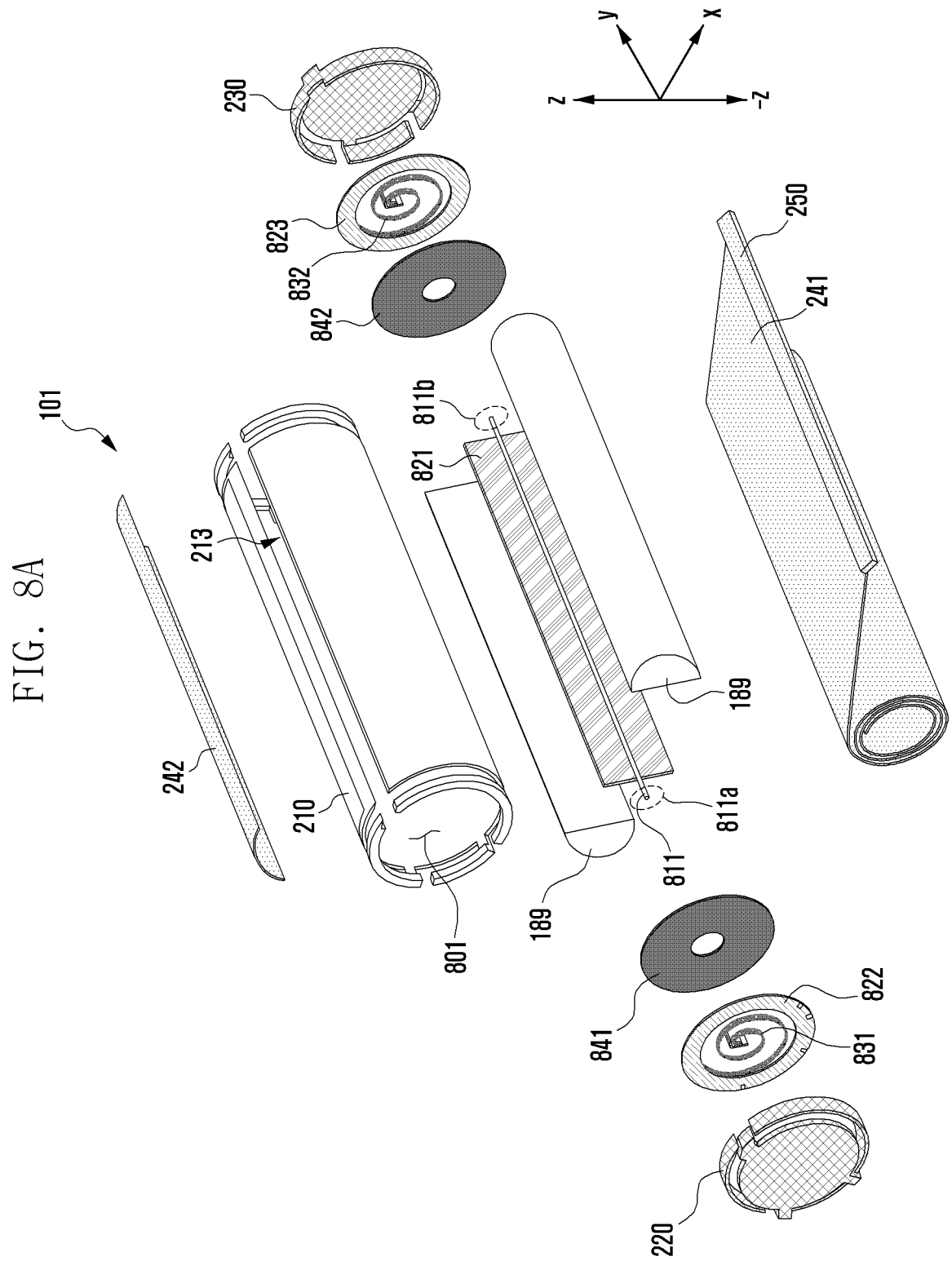
FIG. 8A is an exploded perspective view of an electronic device according to an embodiment of the disclosure.

FIG. 8A is an exploded perspective view of an electronic device according to an embodiment of the disclosure.

Figure 8B:
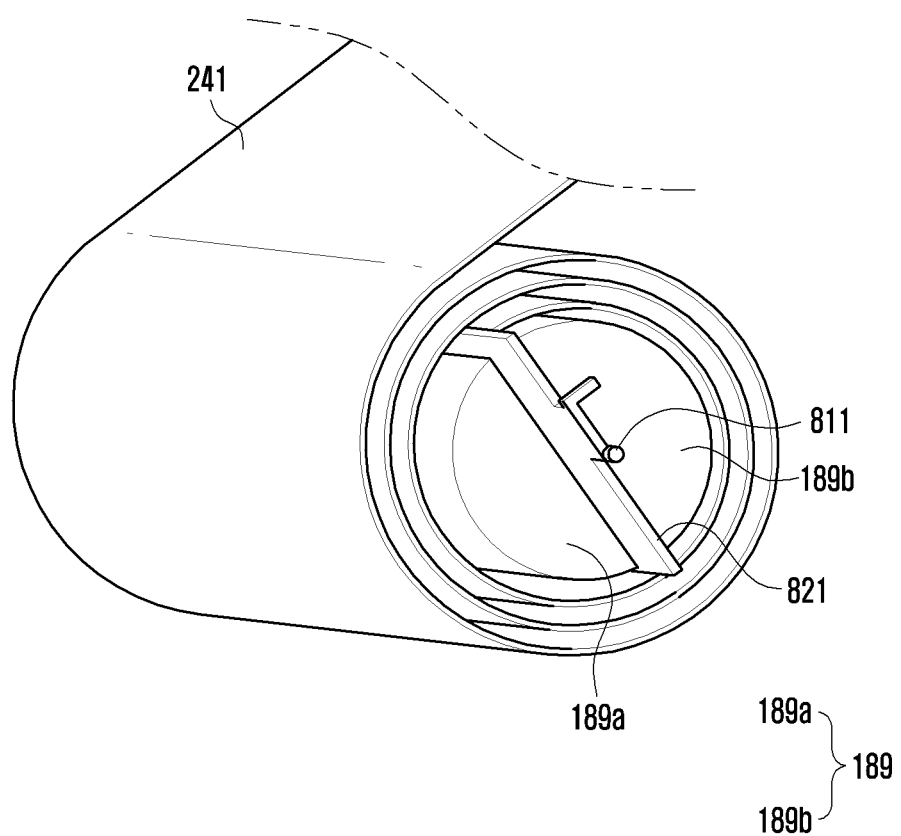
FIG. 8B is a perspective view illustrating a state in which a printed circuit board and a battery are coupled to each other according to an embodiment of the disclosure.

FIG. 8B is a perspective view illustrating a state in which a printed circuit board and a battery are coupled to each other according to an embodiment of the disclosure.

Figure 9:
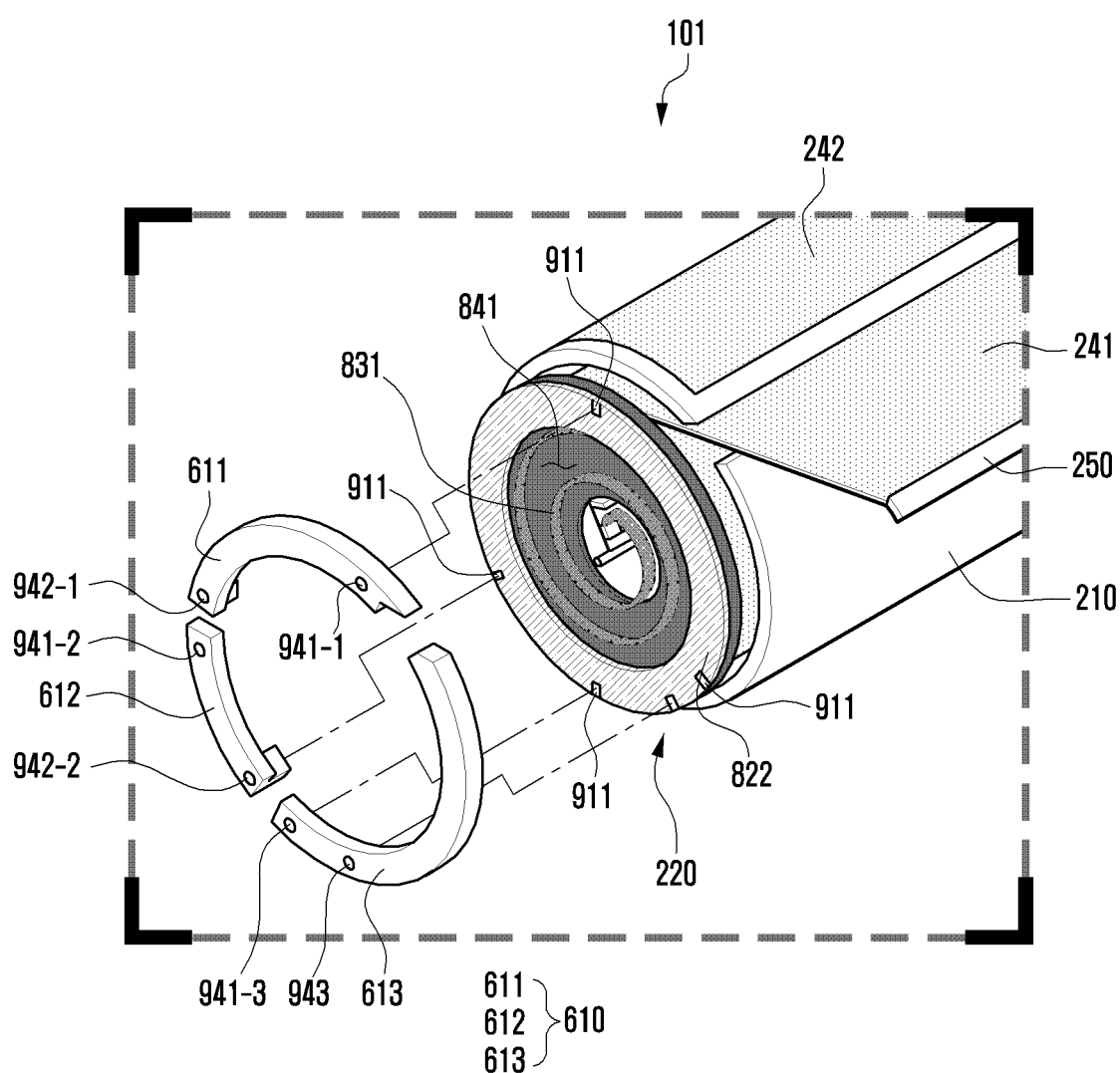
FIG. 9 is a front perspective view illustrating a contact structure of an antenna of an electronic device according to an embodiment of the disclosure.

FIG. 9 is a front perspective view illustrating a contact structure of an antenna of an electronic device according to an embodiment of the disclosure.

Referring to FIGS. 8A, 8B, and 9, the electronic device 101 may include an embodiment that is at least partially similar to or different from the electronic device 101 illustrated in FIGS. 1 to 7. Hereinafter, features of the electronic device 101 that have not been described with reference to FIGS. 1 to 7 or are changed from FIGS. 1 to 7 will be mainly described with reference to FIGS. 8A, 8B, and 9.

According to an embodiment of the disclosure, in the inner space (e.g., the space 801 of FIG. 8A) of the housing 200, a rotary shaft 811 (or a rotary bar) may be disposed in the first direction of the electronic device 101 (the y direction). According to an embodiment of the disclosure, the rotary shaft 811 may be aligned to substantially pass through the center of the main body 210. For example, the rotary shaft 811 may be disposed in parallel to the center of the first flat portion 220 and the center of the second flat portion 230.

According to an embodiment of the disclosure, the rotary shaft 811 may rotate based on a predetermined event. For example, a predetermined event may include various types of user inputs.

According to an embodiment of the disclosure, in the inner space 801 of the housing 200, a first PCB 821 (e.g., a main PCB) coupled to the rotary shaft 811 and rotating following the rotation of the rotary shaft 811 may be disposed. For example, when the rotary shaft 811 rotates clockwise, the first PCB 821 may rotate clockwise. For example, when the rotary shaft 811 rotates counterclockwise, the first PCB 821 may rotate counterclockwise.

According to an embodiment of the disclosure, at least one battery 189 (e.g., the battery 189 of FIG. 1) may be disposed in the inner space 801 of the housing 200 to face the first PCB 821. For example, the battery 189 may be disposed on each of the opposite surfaces of the first PCB 821. Referring to FIG. 8B, the battery may include a first battery 189a disposed to face one surface of the first PCB 821 and a second battery 189b disposed to face the other surface of the first PCB 821.

According to an embodiment of the disclosure, the battery 189 may have a shape corresponding to that of the housing 200. For example, the battery 189 may have a semi-cylindrical shape and may be disposed to face the first PCB 821. According to an embodiment of the disclosure, the battery 189 may rotate together with the first PCB 821 following the rotation of the rotary shaft 811.

According to an embodiment of the disclosure, in the first state, at least a portion of the first display 241 may be accommodated in the inner space 801 of the housing 200. According to an embodiment of the disclosure, the first display 241 is a rollable display and may be disposed in a state in which at least a portion of the first display 241 is rolled in the inner space 801 of the housing 200. According to an embodiment of the disclosure, in the first state of the electronic device 101, a portion of the first display 241 may be disposed in the inner space 801 of the housing 200 to surround the outer periphery of the first PCB 821. According to an embodiment of the disclosure, the first display 241 may be pushed out from inside to outside of the housing 200 or pulled into inside from outside of the housing 200 in interlocking with the rotation of the rotary shaft 811.

In switching to the first state (e.g., the contracted state) and/or the second state (e.g., an extended state), the electronic device 101 according to various embodiments of the disclosure may be manually switched by a user or may be automatically switched by a drive mechanism (not illustrated) (e.g., a drive motor, a reduction gear module, and/or a gear assembly) disposed inside the housing 200.

According to an embodiment of the disclosure, an operation of the drive mechanism may be triggered based on a user input. According to an embodiment of the disclosure, the user input for triggering the operation of the drive mechanism may include a touch input, a force touch input, and/or a gesture input via the first display 241 or the second display 242. In another embodiment of the disclosure, the user input for triggering the operation of the drive mechanism may include a voice input or an input by a physical button (e.g., a button 1611 in FIG. 16) visually exposed outside through a portion of the main body 210.

According to an embodiment of the disclosure, a second PCB 822 may be disposed in the inner space 801 of the housing 200. According to an embodiment of the disclosure, the second PCB 822 may be disposed between the first flat portion 220 and the first PCB 821 in the inner space 801 of the housing 200. According to an embodiment of the disclosure, the second PCB 822 may be fixed by being coupled with a portion of the main body 210 in the inner space 801 of the housing 200. According to an embodiment of the disclosure, the second PCB 822 may be fixed regardless of the rotation of the rotary shaft 811 by being coupled to a portion of the main body 210.

Referring to FIG. 9, the second PCB 822 according to an embodiment may be electrically connected to the conductive portion 610 of the first flat portion 220 via a first connecting member 911. According to an embodiment of the disclosure, the conductive portion 610 may include the first conductive portion 611 used as a first antenna, the second conductive portion 612 used as a second antenna, and/or a third conductive portion 613 used as a third antenna. According to an embodiment of the disclosure, the second PCB 822 may be electrically connected to the first conductive portion 611, the second conductive portion 612, and/or the third conductive portion 613 via the first connecting member 911. According to an embodiment of the disclosure, the first connecting member 911 may include a C-clip or a pogo pin.

According to an embodiment of the disclosure, the first conductive portion 611, the second conductive portion 612, and/or the third conductive portion 613 arranged on the first flat portion 220 may be configured as a planner inverted F antenna (PIFA). According to an embodiment of the disclosure, the first conductive portion 611, the second conductive portion 612, and/or the third conductive portion 613 may be electrically connected to at least one feeding portion (not illustrated) disposed on the second PCB 822 and/or at least one ground via the first connecting member 911.

According to an embodiment of the disclosure, the first conductive portion 611 of the first flat portion 220 may be configured to operate as a first antenna by including a first feeding point 941-1 electrically connected to a feeding portion of the second PCB 822 via the first connecting member 911 and a first ground point 942-1 electrically connected to a ground of the second PCB 822 via the first connecting member 911. According to an embodiment of the disclosure, the second conductive portion 612 of the first flat portion 220 may be configured to operate as a second antenna by including a second feeding point 941-2 electrically connected to the feeding portion of the second PCB 822 via the first connecting member 911 and a second ground point 942-2 electrically connected to the ground of the second PCB 822 via the first connecting member 911.

According to an embodiment of the disclosure, the third conductive portion 613 of the first flat portion 220 may be configured to operate as a third antenna by including a third feeding point 941-3 electrically connected to the feeding portion of the second PCB 822 via the first connecting member 911 and a switch portion 943 electrically connected to a switch of the second PCB 822 via the first connecting member 911.

According to an embodiment of the disclosure, a third PCB 823 may be disposed in the inner space 801 of the housing 200. According to an embodiment of the disclosure, the third PCB 823 may be disposed between the second flat portion 230 and the first PCB 821 in the inner space 801 of the housing 200. According to an embodiment of the disclosure, the third PCB 823 may be fixed by being coupled with a portion of the main body 210 in the inner space 801 of the housing 200. According to an embodiment of the disclosure, the third PCB 823 may be fixed regardless of the rotation of the rotary shaft 811 by being coupled to a portion of the main body 210. According to an embodiment of the disclosure, the third PCB 823 may be disposed to be substantially parallel to the second PCB 822.

According to an embodiment of the disclosure, the third PCB 823 may be electrically connected to the conductive portion 610 of the second flat portion 230 via a second connecting member (not illustrated). According to an embodiment of the disclosure, the conductive portion 610 may include the first conductive portion 611 used as a first antenna, the second conductive portion 612 used as a second antenna, and/or a third conductive portion 613 used as a third antenna. According to an embodiment of the disclosure, the third PCB 823 may be electrically connected to the first conductive portion 611, the second conductive portion 612, and/or the third conductive portion 613 via a second connecting member (not illustrated). According to an embodiment of the disclosure, the second connecting member (not illustrated) may include a C-clip or a pogo pin.

According to an embodiment of the disclosure, the first conductive portion 611, the second conductive portion 612, and/or the third conductive portion 613 arranged on the second flat portion 230 may be configured as a planner inverted F antenna (PIFA). According to an embodiment of the disclosure, the first conductive portion 611, the second conductive portion 612, and/or the third conductive portion 613 may be electrically connected to at least one feeding portion (not illustrated) disposed on the third PCB 823 and/or at least one ground via the second connecting member (not illustrated).

According to an embodiment of the disclosure, a first rollable FPCB 831 may be disposed in the inner space 801 of the housing 200. According to an embodiment of the disclosure, the first rollable FPCB 831 may electrically connect the first PCB 821 and the second PCB 822 to each other and may be spirally rolled around one end 811a of the rotary shaft 811.

According to an embodiment of the disclosure, a second rollable FPCB 832 may be disposed in the inner space 801 of the housing 200. According to an embodiment of the disclosure, the second rollable FPCB 832 may electrically connect the first PCB 821 and the third PCB 823 to each other and may be spirally rolled around the other end 811b of the rotary shaft 811.

According to an embodiment of the disclosure, a first shield member 841 may be disposed between the first rollable FPCB 831 and the first PCB 821. As another embodiment of the disclosure, a second shield member 842 may be disposed between the second rollable FPCB 832 and the first PCB 821.

According to an embodiment of the disclosure, the first rollable FPCB 831 may form a radiation pattern directed from the first shield member 841 toward the first flat portion 220 by including at least one wire (e.g., a plurality of wires 1241, 1242, and 1243 of FIG. 12) configured to provide a wireless charging function.

According to an embodiment of the disclosure, the second rollable FPCB 832 may form a radiation pattern directed from the second shield member 842 toward the second flat portion 230 by including at least one wire (e.g., the plurality of wires 1241, 1242, and 1243 of FIG. 12) configured to provide a wireless charging function.

Figure 10:
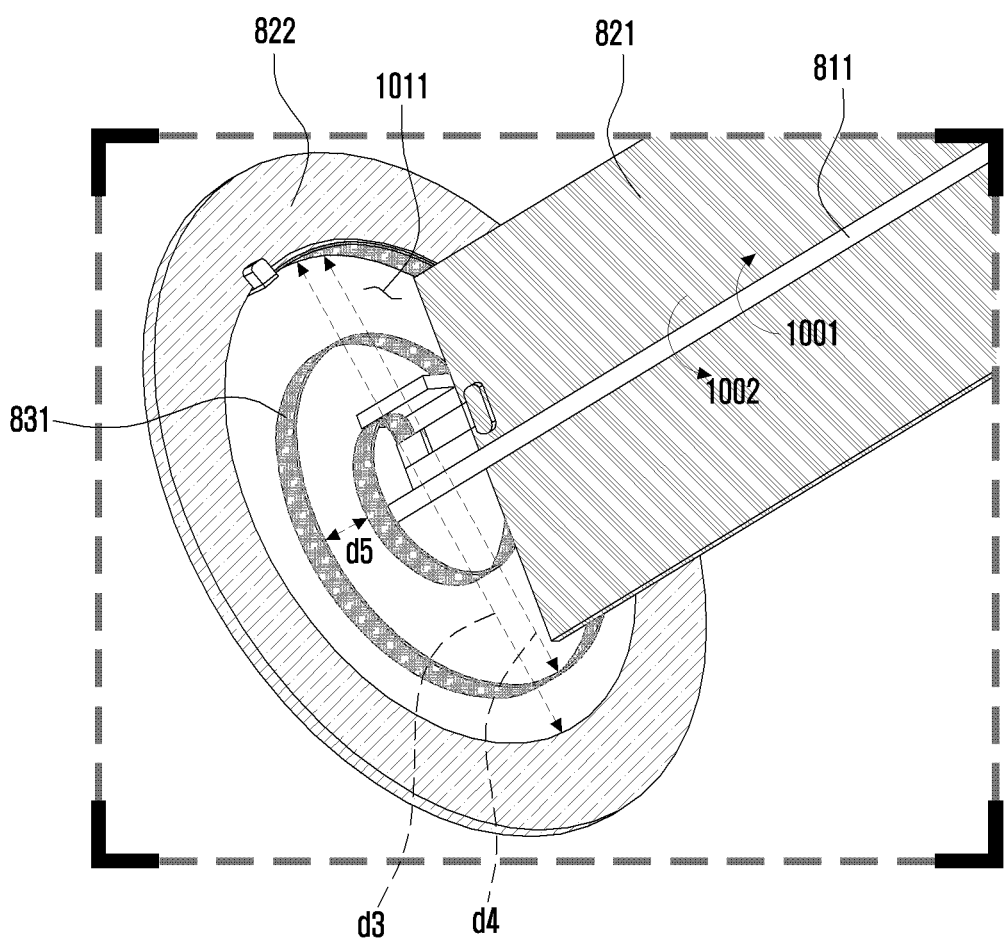
FIG. 10 is a rear perspective view illustrating a contact structure of an antenna of an electronic device according to an embodiment of the disclosure.

FIG. 10 is a rear perspective view illustrating a contact structure of an antenna of an electronic device according to an embodiment of the disclosure.

Referring to FIG. 10, the electronic device 101 may include an embodiment that is at least partially similar to or different from the electronic device 101 illustrated in FIGS. 1 to 7, 8A, 8B, and 9. Hereinafter, features of the electronic device 101 that have not been described with reference to FIGS. 1 to 7, 8A, 8B, and 9 or are changed from FIGS. 1 to 7, 8A, 8B, and 9 will be mainly described with reference to FIG. 10.

According to an embodiment of the disclosure, the second PCB 822 may be disposed to face the first flat portion 220 and may have a circular first opening 1011 in the center thereof, thereby having a ring shape.

According to an embodiment of the disclosure, the first rollable FPCB 831 may be spirally rolled and may have a diameter smaller than or equal to the diameter d3 of the first opening 1011 in the second PCB 822. For example, the maximum diameter d4 of the rolled first rollable FPCB 831 may be smaller than or equal to the diameter d3 of the first opening 1011 in the second PCB 822. According to an embodiment of the disclosure, the first rollable FPCB 831 may be spirally rolled, and the maximum diameter d4 of the outermost portion of the first rollable FPCB 831 may be smaller than or equal to the diameter d3 of the first opening 1011 in the second PCB 822.

Although not illustrated, according to an embodiment of the disclosure, the third PCB 823 may be disposed to face the second flat portion 230 and may have a circular second opening (not illustrated) in the center thereof, thereby having a ring shape. According to an embodiment of the disclosure, the third PCB 823 may have substantially the same structure and shape as the second PCB 822.

Although not illustrated, the second rollable FPCB 832 according to an embodiment may be spirally rolled and may have a diameter smaller than or equal to the diameter of the second opening in the third PCB 823. For example, the maximum diameter d4 of the rolled second rollable FPCB 832 may be smaller than or equal to the diameter of the second opening in the third PCB 823. According to an embodiment of the disclosure, the second rollable FPCB 832 may be spirally rolled, and the maximum diameter d4 of the outermost portion of the second rollable FPCB 832 may be smaller than or equal to the diameter of the second opening in the third PCB 823. According to an embodiment of the disclosure, the second rollable FPCB 832 may have substantially the same structure and shape as the first rollable FPCB 831.

According to an embodiment of the disclosure, one end of the first rollable FPCB 831 may be disposed adjacent to one end 811a of the rotary shaft 811 and may be electrically connected to a portion of the first PCB 821, and the other end of the first rollable FPCB 831 may be electrically connected to a portion of the second PCB 822.

Although not illustrated, according to an embodiment of the disclosure, one end of the second rollable FPCB 832 may be disposed adjacent to the other end 811b of the rotary shaft 811 and may be electrically connected to a portion of the first PCB 821, and the other end of the second rollable FPCB 832 may be electrically connected to a portion of the third PCB 823.

According to an embodiment of the disclosure, the first rollable FPCB 831 may electrically connect a portion of the first PCB 821 and a portion of the second PCB 822 to each other in a connector-to-connector manner. According to an embodiment of the disclosure, the curvature and diameter of at least a portion of the first rollable FPCB 831 may be variable as the first PCB 821 and the rotary shaft 811 rotate. According to an embodiment of the disclosure, as the first PCB 821 and the rotary shaft 811 rotate clockwise (in a direction indicated by arrow 1001 in FIG. 10), the surface of the first rollable FPCB 831 may increase in curvature and may decrease in diameter in at least a portion adjacent to the first PCB 821. For example, as the first PCB 821 and the rotary shaft 811 rotate clockwise (in the direction indicated by arrow 1001 in FIG. 10), the distance d5 between a first portion of the first rollable PCB 831 disposed in a $k^{th}$ turn and a second portion of the first rollable FPCB 831 disposed in a $(k+1)^{th}$ turn of the first rollable FPCB 831 may decrease. For example, the number of turns of the first rollable FPCB 831 may increase as the first PCB 821 and the rotary shaft 811 rotate clockwise (in the direction indicated by arrow 1001 in FIG. 10).

According to an embodiment of the disclosure, as the first PCB 821 and the rotary shaft 811 rotate counterclockwise (in a direction indicated by arrow 1002 in FIG. 10), the surface of the first rollable FPCB 831 may decrease in curvature and may increase in diameter in at least a portion adjacent to the first PCB 821. For example, as the first PCB 821 and the rotary shaft 811 rotate counterclockwise (in the direction indicated by arrow 1001 in FIG. 10), the distance d5 between the first portion of the first rollable PCB 831 disposed in the $k^{th}$ turn and the second portion of the first rollable FPCB 831 disposed in the $(k+1)^{th}$ turn of the first rollable FPCB 831 may increase.

According to various embodiments of the disclosure, the curvature of the surface of the first rollable FPCB 831 may be variable depending on whether the electronic device 101 is in the first state (e.g., the slide-in state) or in the second state (e.g., the slide-out state).

According to an embodiment of the disclosure, when the electronic device 101 is switched from the first state to the second state, the first PCB 821 and the rotary shaft 811 may rotate counterclockwise (in the direction indicated by arrow 1002 in FIG. 10). In this case, the curvature of the surface of the first rollable FPCB 831 may decrease in interlocking with the switching of the electronic device 101 from the first state to the second state.

According to an embodiment of the disclosure, when the electronic device 101 is switched from the second state to the first state, the first PCB 821 and the rotary shaft 811 may rotate clockwise (in the direction indicated by arrow 1001 in FIG. 10). In this case, the curvature of the surface of the first rollable FPCB 831 may increase in interlocking with the switching of the electronic device 101 from the first state to the second state.

According to another embodiment of the disclosure, when the electronic device 101 is switched from the first state to the second state, the first PCB 821 and the rotary shaft 811 may rotate clockwise (in the direction indicated by arrow 1001 in FIG. 10). In this case, the curvature of the surface of the first rollable FPCB 831 may increase in interlocking with the switching of the electronic device 101 from the first state to the second state.

According to another embodiment of the disclosure, when the electronic device 101 is switched from the second state to the first state, the first PCB 821 and the rotary shaft 811 may rotate counterclockwise (in the direction indicated by arrow 1002 in FIG. 10). In this case, the curvature of the surface of the first rollable FPCB 831 may decrease in interlocking with the switching of the electronic device 101 from the first state to the second state.

Although not illustrated, the second rollable FPCB 832 according to an embodiment may electrically connect a portion of the first PCB 821 and a portion of the third PCB 823 to each other in a connector-to-connector manner. According to an embodiment of the disclosure, the curvature and diameter of at least a portion of the second rollable FPCB 832 may be variable as the first PCB 821 and the rotary shaft 811 rotate. According to an embodiment of the disclosure, as the first PCB 821 and the rotary shaft 811 rotate clockwise, the surface of the second rollable FPCB 832 may increase in curvature and may decrease in diameter in at least a portion adjacent to the first PCB 821. For example, as the first PCB 821 and the rotary shaft 811 rotate clockwise, the distance between a first portion of the second rollable PCB 832 disposed in the $k^{th}$ turn and a second portion of the second rollable FPCB 832 disposed in the $(k+1)^{th}$ turn of the second rollable FPCB 832 may decrease. According to an embodiment of the disclosure, as the first PCB 821 and the rotary shaft 811 rotate counterclockwise, the surface of the second rollable FPCB 832 may decrease in curvature and may increase in diameter in at least a portion adjacent to the first PCB 821. For example, as the first PCB 821 and the rotary shaft 811 rotate clockwise, the distance between the first portion of the second rollable PCB 832 disposed in the $k^{th}$ turn and the second portion of the second rollable FPCB 832 disposed in the $(k+1)^{th}$ turn of the second rollable FPCB 832 may increase.

Although not illustrated, according to an embodiment of the disclosure, when the electronic device 101 is switched from the first state to the second state, the first PCB 821 and the rotary shaft 811 may rotate counterclockwise (in the direction indicated by arrow 1002 in FIG. 10). In this case, the curvature of the surface of the second rollable FPCB 832 may decrease in interlocking with the switching of the electronic device 101 from the first state to the second state.

Although not illustrated, according to an embodiment of the disclosure, when the electronic device 101 is switched from the second state to the first state, the first PCB 821 and the rotary shaft 811 may rotate clockwise (in the direction indicated by arrow 1001 in FIG. 10). In this case, the curvature of the surface of the second rollable FPCB 832 may increase in interlocking with the switching of the electronic device 101 from the first state to the second state.

Although not illustrated, according to another embodiment of the disclosure, when the electronic device 101 is switched from the first state to the second state, the first PCB 821 and the rotary shaft 811 may rotate clockwise (in the direction indicated by arrow 1001 in FIG. 10). In this case, the curvature of the surface of the second rollable FPCB 832 may increase in interlocking with the switching of the electronic device 101 from the first state to the second state.

Although not illustrated, according to another embodiment of the disclosure, when the electronic device 101 is switched from the second state to the first state, the first PCB 821 and the rotary shaft 811 may rotate counterclockwise (in the direction indicated by arrow 1002 in FIG. 10). In this case, the curvature of the surface of the second rollable FPCB 832 may decrease in interlocking with the switching of the electronic device 101 from the first state to the second state.

Figure 11A:
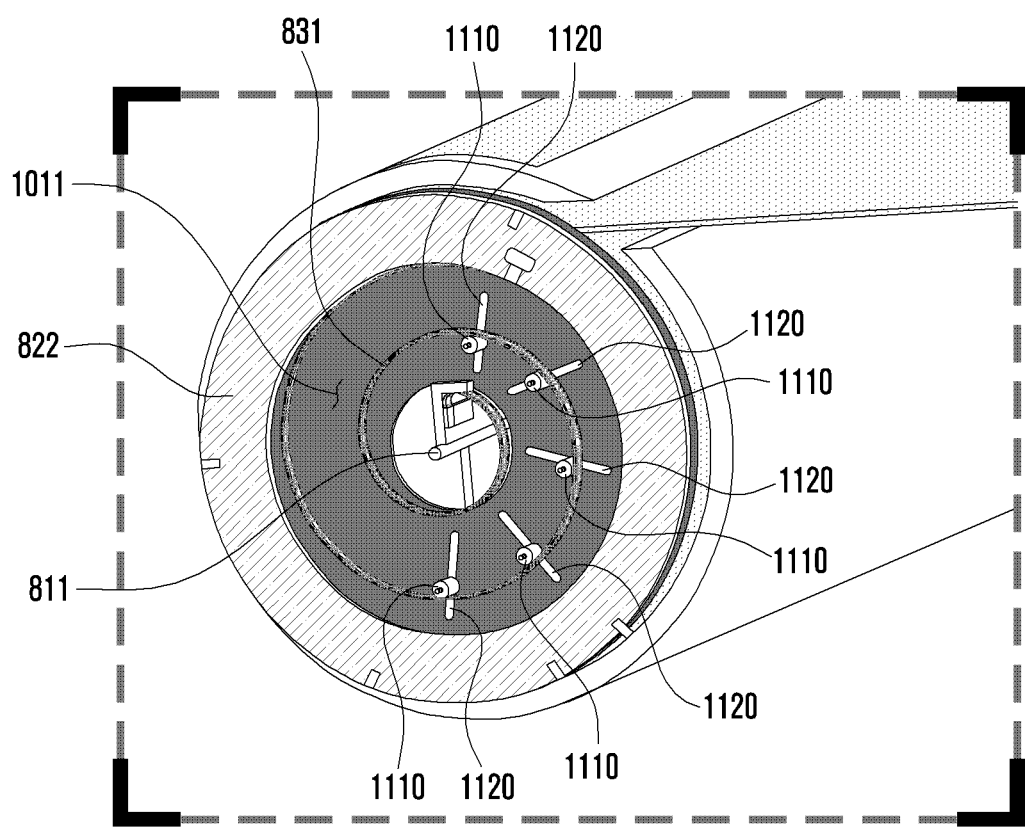
FIG. 11A is a perspective view of an electronic device illustrating guide wheels configured to guide a movement of a rollable FPCB according to an embodiment of the disclosure.

FIG. 11A is a perspective view of an electronic device illustrating guide wheels configured to guide a movement of a rollable FPCB according to an embodiment of the disclosure.

Figure 11B:
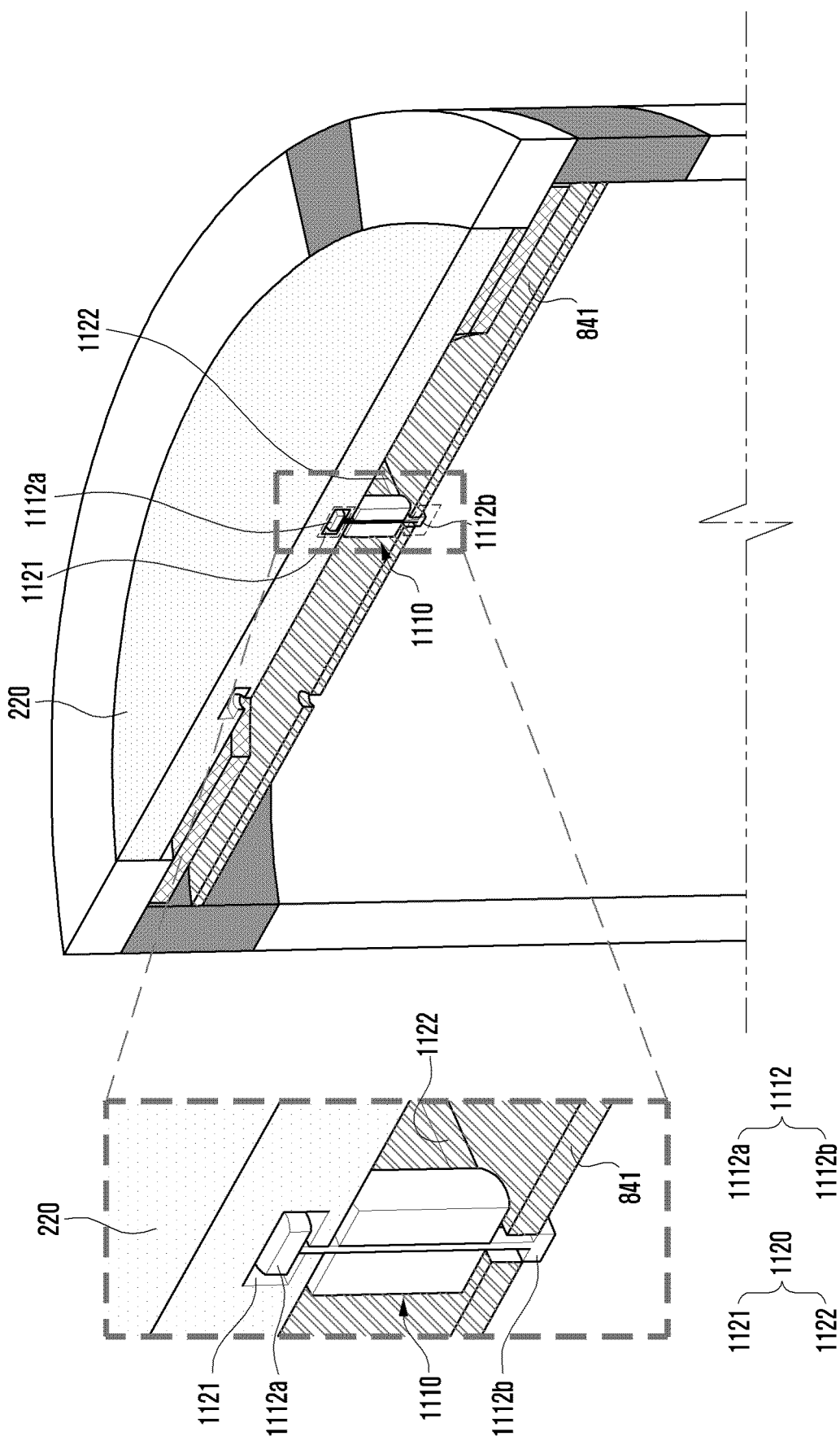
FIG. 11B is a cross-sectional view of an electronic device illustrating a cross section of a guide wheel according to an embodiment of the disclosure.

FIG. 11B is a cross-sectional view of an electronic device illustrating a cross section of a guide wheel according to an embodiment of the disclosure.

Referring to FIGS. 11A and 11B, the electronic device 101 may include an embodiment that is at least partially similar to or different from the electronic device 101 illustrated in FIGS. 1 to 7, 8A, 8B, 9, and 10. Hereinafter, features of the electronic device 101 that have not been described with reference to FIGS. 1 to 7, 8A, 8B, 9, and 10 or are changed from FIGS. 1 to 7, 8A, 8B, 9, and 10 will be mainly described with reference to FIGS. 11A and 11B.

Referring to FIGS. 11A and 11B, an electronic device (e.g., the electronic device 101 of FIG. 1) according to an embodiment may include one or more guide wheels 1110 configured to guide the movement of a rollable FPCB (e.g., the first rollable FPCB 831 or the second roller FPCB 832 of FIG. 5).

According to an embodiment of the disclosure, the guide wheel 1110 may be disposed in a first opening 1011 (e.g., the first opening 1011 in FIG. 10) in the center of the second PCB 822 and may rotate along the surface of the first rollable FPCB 831. According to an embodiment of the disclosure, the guide wheel 1110 may be configured to rotate along the surface of the first rollable FPCB 831 and/or the second rollable FPCB 832, thereby reducing damage to the first rollable FPCB 831 and/or the second rollable FPCB 831. For example, as described above, the curvature and diameter of at least a portion of the first rollable FPCB 831 and/or the second rollable FPCB 832 may be variable as the rotary shaft 811 rotates. The guide wheels 1110 according to an embodiment may reduce an impact applied to the first rollable FPCB 831 and/or the second rollable FPCB 832 when the first rollable FPCB 831 and/or the second rollable FPCB 832 are bent or rolled as described above, thereby reducing the damage to the first rollable FPCB 831 and/or the second rollable FPCB 832.

Although not illustrated, the guide wheels 1110 may be disposed in the second opening (not illustrated) in the center of the third PCB 823 and may rotate along the surface of the second rollable FPCB 832.

Referring to FIG. 11A, the guide wheels 1110 according to an embodiment may be disposed to be movable along rail members 1120, respectively. According to an embodiment of the disclosure, the rail members 1120 may be disposed respectively from outer portions of the first openings 1011 adjacent to the second PCB 822 to be directed toward the central portions adjacent to the rotary shaft 811 of the electronic device 101. Accordingly, the guide wheels 1110 may reciprocate respectively between the outer portions of the first openings 1011 adjacent to the second PCB 822 and the central portions adjacent to the rotary shaft 811 of the electronic device 101. According to various embodiments of the disclosure, the electronic device 101 may include one or more rail members 1120 corresponding to the number of guide wheels 1110, and the one or more rail members 1120 may be arranged to be directed toward the rotary shaft 811 of the electronic device 101. According to various embodiments of the disclosure, the number of guide wheels 1110 is not limited to that illustrated in the drawings.

Referring to FIG. 11B, each guide wheel 1110 according to an embodiment may include a wheel member 1110 configured to come into contact with the surface of the first rollable FPCB 831 and/or the second rollable FPCB 832 and a guide shaft 1112 penetrating the wheel member 1110. According to an embodiment of the disclosure, the guide shaft 1112 of the guide wheel 1110 may move along a rail member 1120.

According to an embodiment of the disclosure, the rail member 1120 may be configured to guide the movement of opposite ends of the guide shaft 1112 of the guide wheel 1110. The rail member 1120 according to an embodiment may include a first rail member 1121 provided on the first flat portion 220 and a second rail member 1122 provided on the first shield member 841.

According to an embodiment of the disclosure, the first rail member 1121 may be provided on the first flat portion 220 and may be configured to guide one end 1112a of the guide shaft 1112 of the guide wheel 1110 to reciprocate between an outer portion of the first opening 1011 and a central portion adjacent to the rotary shaft (e.g., the rotary shaft 811 of FIG. 11B) of the electronic device 101.

According to an embodiment of the disclosure, the second rail member 1122 may be provided on the first shield member 841 and may be configured to guide the other end 1112b of the guide shaft 1112 of the guide wheel 1110 to reciprocate between the outer portion of the first opening 1011 and the central portion adjacent to the rotary shaft 811 of the electronic device 101.

Although not illustrated, the first rail member 1121 and the second rail member 1122 according to an embodiment may be similarly provided on the second flat portion 230. For example, although not illustrated, the first rail member 1121 according to an embodiment may be provided on the second flat portion 230 and may be configured to guide the one end 1112a of the guide shaft 1112 of the guide wheel 1110 to reciprocate between an outer portion of a second opening (not illustrated) and a central portion adjacent to the rotary shaft (e.g., the rotary shaft 811 of FIG. 11B) of the electronic device 101. For example, although not illustrated, the second rail member 1122 according to an embodiment may be provided on the second shield member 842 and may be configured to guide the other end 1112b of the guide shaft 1112 of the guide wheel 1110 to reciprocate between the outer portion of the first opening 1011 and the central portion adjacent to the rotary shaft 811 of the electronic device 101.

Figure 12:
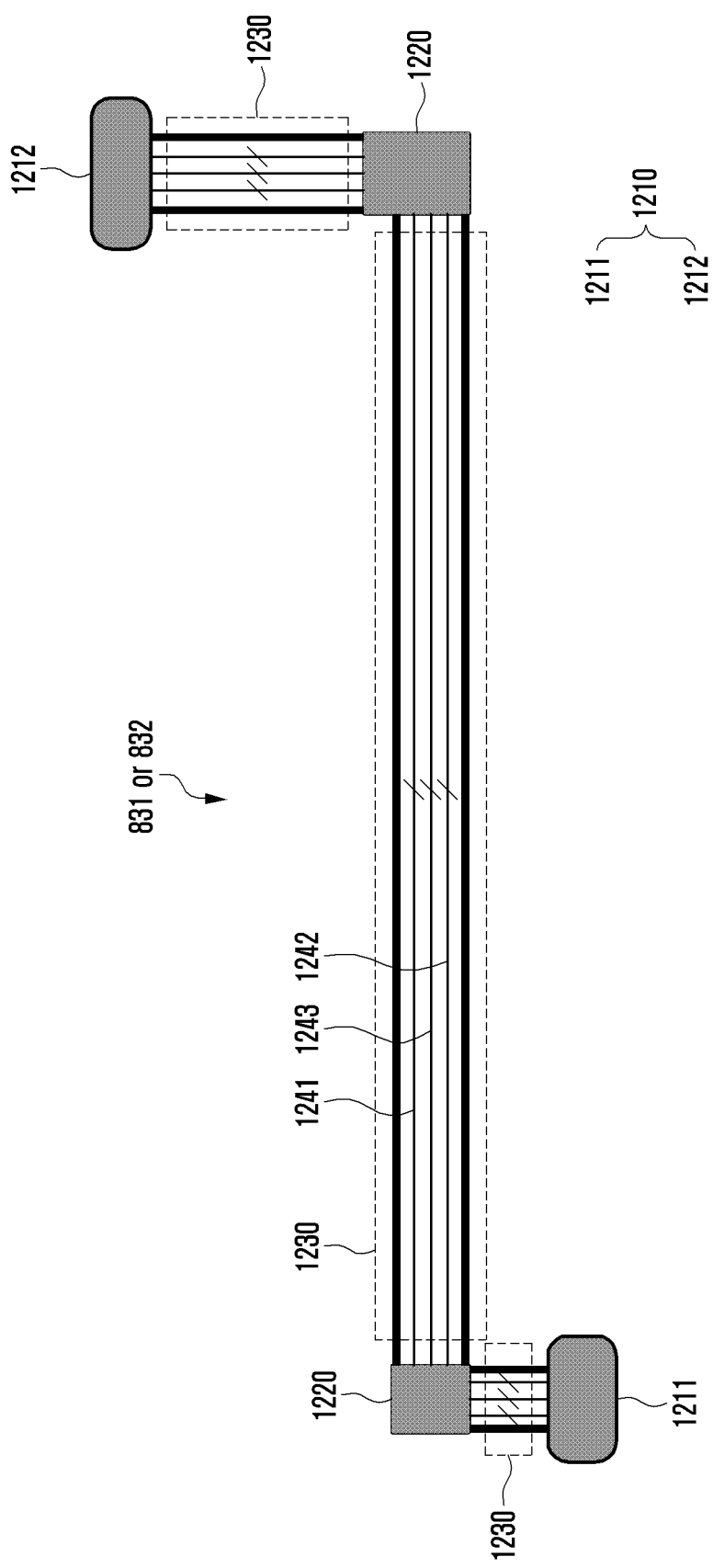
FIG. 12 is a plan view schematically illustrating a structure of a rollable FPCB according to an embodiment of the disclosure.

FIG. 12 is a plan view schematically illustrating a structure of a rollable FPCB according to an embodiment of the disclosure.

The rollable FPCB illustrated in FIG. 12 may include an embodiment that is at least partially similar to or different from the first rollable FPCB or the second rollable FPCB illustrated in FIG. 8A. Hereinafter, features of the rollable FPCB that have not been described with reference to FIGS. 1 to 7, 8A, 8B, 9, 10, 11A and 11B or are changed from FIGS. 1 to 7, 8A, 8B, 9, 10, 11A and 11B will be mainly described with reference to FIG. 12.

Referring to FIG. 12, a rollable FPCB (e.g., the first rollable FPCB 831 and/or the second rollable FPCB 832 of FIG. 8A) according to an embodiment may include one or more connector areas, one or more nonelastic areas, and/or one or more elastic areas.

According to an embodiment of the disclosure, each connector area 1210 is an area including a connector (not illustrated) and/or a pad (not illustrated) and may include a first connector area 1211 coupled to a first PCB (e.g., the first PCB in FIG. 8A) and/or a second connector area 1212 coupled to a second PCB (e.g., the second PCB 822 in FIG. 8A or the third PCB 823 in FIG. 8A).

According to an embodiment of the disclosure, each nonelastic area 1220 may include a rigid PCB made of a rigid material (or a non-flexible material). According to an embodiment of the disclosure, at least one nonelastic area 1220 may be disposed between the first connector area 1211 and the second connector area 1212. For example, the nonelastic region 1220 may be disposed between the first connector area 1211 and the second connector area 1212 to correspond to a portion in which the rollable FPCB (e.g., the first rollable FPCB 831 and/or the second roller FPCB of FIG. 8A) is bent.

According to an embodiment of the disclosure, an elastic area 1230 may be disposed between the connector area 1210 and the nonelastic area 1220 and may include the plurality of wires 1241, 1242, and 1243. According to an embodiment of the disclosure, the plurality of wires 1241, 1242, and 1243 disposed in the elastic area 1230 may include at least one signal wire 1241 configured to transmit an RF signal or a control signal, a wireless charging wire 1242 configured to provide a wireless charging function, and/or at least one ground wire 1243 electrically connected to a ground. According to an embodiment of the disclosure, the ground wire 1243 may be disposed between the signal wire 1241 and the wireless charging wire 1242. For example, the wireless charging wire 1242 and the at least one signal wire 1241 are spaced apart from each other with the ground wire 1243 interposed therebetween, thereby reducing signal interference or noise.

According to an embodiment of the disclosure, the wireless charging wire 1242 may be disposed at the outermost portion among the plurality of wires 1241, 1242, and 1243. For example, among the plurality of wires 1241, 1242, and 1243, the wireless charging wire 1242 may be disposed closest to the first flat portion 220 or the second flat portion 230. When the wireless charging wire 1242 and a first shield member (e.g., the first shield member 841 of FIG. 8A) (or the second shield member (e.g., the second shield member 842 of FIG. 8A)) is disposed close to the first flat portion 220 or the second flat portion 230, the electronic device 101 according to an embodiment may provide the wireless charging function via the first flat portion 220 or the second flat portion 230. For example, the battery (e.g., the battery 189 in FIG. 1) of the electronic device 101 can be charged wirelessly when the first flat portion 220 or the second flat portion 230 is placed on a wireless charging pad (or a wireless charging cradle) (not illustrated) configured to feed power wirelessly.

Figure 13:
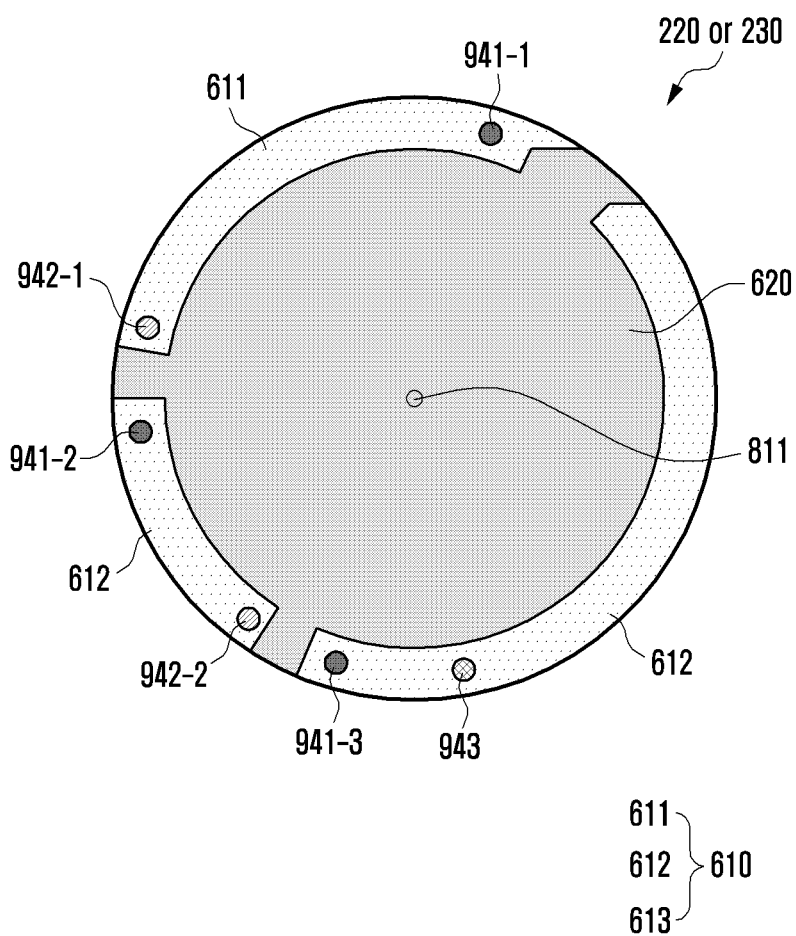
FIG. 13 is a view illustrating a structure of an antenna of an electronic device according to an embodiment of the disclosure.

FIG. 13 is a view illustrating a structure of an antenna of an electronic device according to an embodiment of the disclosure.

The electronic device 101 illustrated in FIG. 13 may include an embodiment that is at least partially similar to or different from the electronic device 101 illustrated in FIGS. 1 to 7, 8A, 8B, 9, 10, 11A, 11B, and 12. Hereinafter, features of the electronic device 101 that have not been described with reference to FIGS. 1 to 7, 8A, 8B, 9, 10, 11A, 11B, and 12 or are changed from FIGS. 1 to 7, 8A, 8B, 9, 10, 11A, 11B, and 12 will be mainly described with reference to FIG. 13.

Referring to FIG. 13, the first flat portion (e.g., the first flat portion 220 of FIG. 8A) or the second flat portion (e.g., the second flat portion 230 of FIG. 8A) according to an embodiment may include the first conductive portion 611, the second conductive portion 612, and/or a third conductive portion 613, which may be split by the non-conductive portion 620.

According to an embodiment of the disclosure, the first conductive portion 611 may operate as a first antenna radiator by including a first feeding point 941-1 electrically connected to a feeding portion of a second PCB (e.g., the second PCB 822 of FIG. 8A) (or the third PCB 823 of FIG. 8A) and a first ground point 942-1 electrically connected to a ground (not illustrated) of the second PCB 822. According to an embodiment of the disclosure, the second conductive portion 612 may operate as a second antenna radiator by including a second feeding point 941-2 electrically connected to the feeding portion of the second PCB 822 (or the third PCB 823 of FIG. 8A) and a second ground point 942-2 electrically connected to the ground of the second PCB 822. According to an embodiment of the disclosure, the third conductive portion 613 may operate as a third antenna by including a third feeding point 941-3 electrically connected to the feeding portion of the second PCB 822 (or the third PCB 823 in FIG. 8A) and a switch connecting point 943 electrically connected to a switch of the second PCB 822 (or the third PCB 823 in FIG. 8A).

Figure 14:
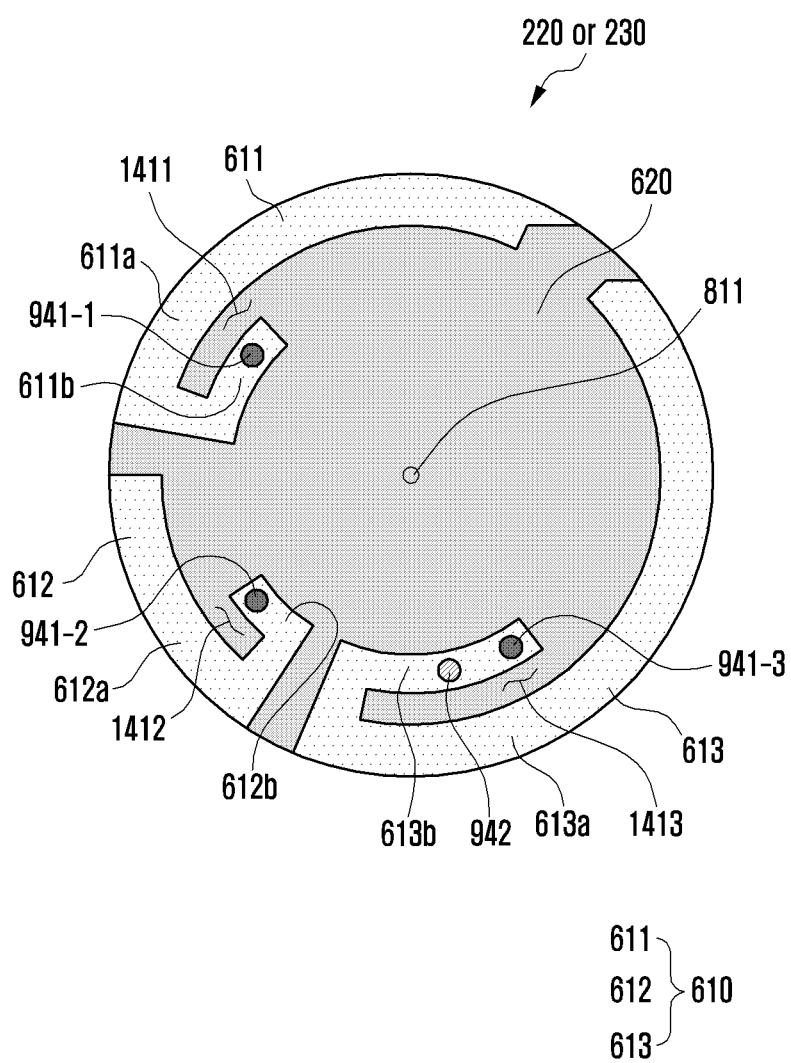
FIG. 14 is a view illustrating a structure of an antenna of an electronic device according to an embodiment of the disclosure.

FIG. 14 is a view illustrating a structure of an antenna of an electronic device according to an embodiment of the disclosure.

The electronic device 101 illustrated in FIG. 14 may include an embodiment that is at least partially similar to or different from the electronic device 101 illustrated in FIGS. 1 to 7, 8A, 8B, 9, 10, 11A, 11B, 12, and 13. Hereinafter, features of the electronic device 101 that have not been described with reference to FIGS. 1 to 7, 8A, 8B, 9, 10, 11A, 11B, 12, and 13 or are changed from FIGS. 1 to 7, 8A, 8B, 9, 10, 11A, 11B, 12, and 13 will be mainly described with reference to FIG. 14.

Referring to FIG. 14, an electronic device 101 according to another embodiment may include extensions 611b, 612b, and 613b obtained by extending lengths of one or more of the first conductive portion 611, the second conductive portion 612, and/or the third conductive portion 613 toward the rotary shaft 811. For example, when conductive portions serving as antennas are disposed only in the outer edge area of the first flat portion (e.g., the first flat portion 220 in FIG. 8A) or the second flat portion (e.g., the second flat portion 230), the length of antennas may be insufficient in the electronic device 101. In the electronic device 101 according to another embodiment of the disclosure, by providing the extensions 611b, 612b, and 613b having lengths extending toward the rotary shaft 811 for one or more of the first conductive portion 611, the second conductive portion 612, and/or the third conductive portion 613, it is possible to increase the length of antennas.

In the electronic device 101 according to another embodiment of the disclosure, since the first conductive portion 611, the second conductive portion 612, and/or the third conductive portion 613 include extensions 611b, 612b, and 613b, it is possible to provide antennas having one or more slit structures 1411, 1412, and 1413. In an embodiment of the disclosure, the shapes of the extensions 611b, 612b, and 613b of the first conductive portion 611, the second conductive portion 612, and/or the third conductive portion 613 may be determined based on the operating frequencies of antennas in which the first conductive portion 611, the second conductive portion 612, and/or the third conductive portion 613 include the extension portions 611b, 612b, and 613b.

According to another embodiment of the disclosure, the first conductive portion 611 may include a first outer portion 611a disposed in the outer edge area of the first flat portion (e.g., the first flat portion 220 of FIG. 8A) or the second flat portion (e.g., the second flat portion 230 of FIG. 8A) and a first extension 611b extending from the first outer portion 611a toward the rotary shaft 811, and a first feeding point 941-1 electrically connected to a feeding portion of the second PCB 822 (or the third PCB 823 in FIG. 8A) may be provided in the first extension 611b. For example, a first slit structure 1411 made of a non-conductive material may be provided between the first outer portion 611a and the first extension 611b.

According to another embodiment of the disclosure, the second conductive portion 612 may include a second outer portion 612a disposed in the outer edge area of the first flat portion (e.g., the first flat portion 220 of FIG. 8A) or the second flat portion (e.g., the second flat portion 230 of FIG. 8A) and a second extension 612b extending from the second outer portion 612a toward the rotary shaft 811, and a second feeding point 941-2 electrically connected to a feeding portion of the second PCB 822 (or the third PCB 823 in FIG. 8A) may be provided in the second extension 612b. For example, a second slit structure 1412 made of a non-conductive material may be provided between the second outer portion 612a and the second extension 612b.

According to another embodiment of the disclosure, the third conductive portion 613 may include a third outer portion 613a disposed in the outer edge area of the first flat portion (e.g., the first flat portion 220 of FIG. 8A) or the second flat portion (e.g., the second flat portion 230 in FIG. 8A) and a third extension 613b extending from the third outer portion 613a toward the rotary shaft 811, and a third feeding point 941-3 electrically connected to a feeding portion of the second PCB 822 (or the third PCB 823 in FIG. 8A) and a ground point 942 electrically connected to a ground may be provided in the third extension 613b. For example, a third slit structure 1413 made of a non-conductive material may be provided between the third outer portion 613a and the third extension 613b.

Figure 15:
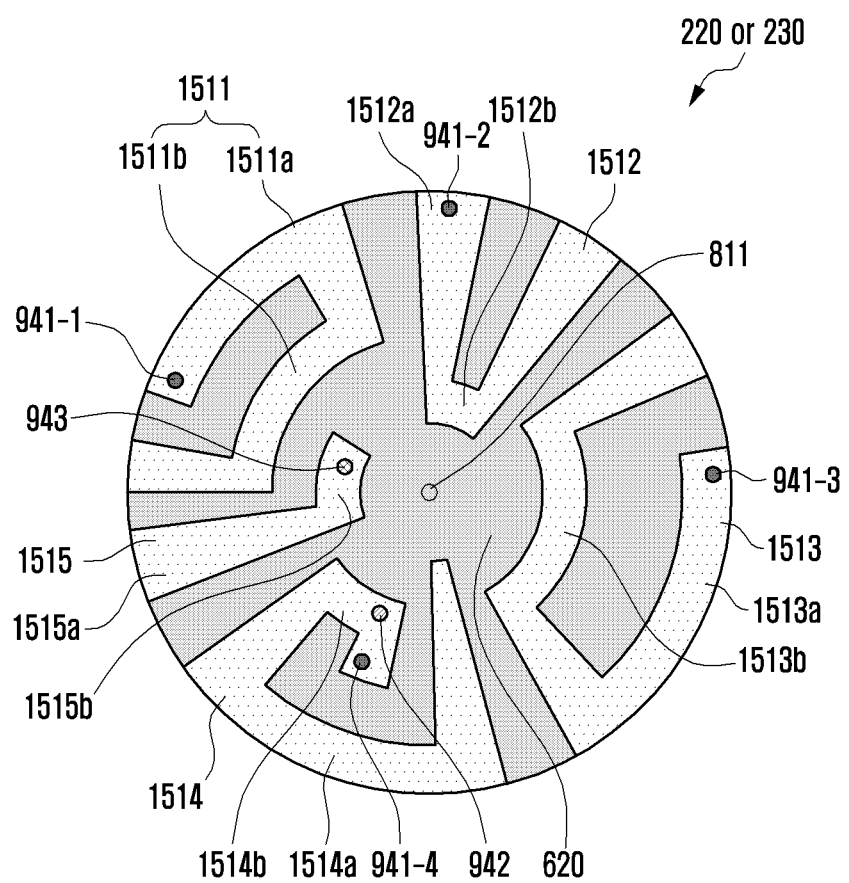
FIG. 15 is a view illustrating a structure of an antenna of an electronic device according to an embodiment of the disclosure.

FIG. 15 is a view illustrating a structure of an antenna of an electronic device according to an embodiment of the disclosure.

The electronic device 101 illustrated in FIG. 15 may include an embodiment that is at least partially similar to or different from the electronic device 101 illustrated in FIGS. 1 to 7, 8A, 8B, 9, 10, 11A, 11B, 12, 13, and 14. Hereinafter, features of the electronic device 101 that have not been described with reference to FIGS. 1 to 7, 8A, 8B, 9, 10, 11A, 11B, 12, 13, and 14 or are changed from FIGS. 1 to 7, 8A, 8B, 9, 10, 11A, 11B, 12, 13, and 14 will be mainly described with reference to FIG. 15.

Referring to FIG. 15, the first flat portion (e.g., the first flat portion 220 of FIG. 8A) or the second flat portion (e.g., the second flat portion 230 of FIG. 8A) according to another embodiment may include a first conductive portion 1511, a second conductive portion 1512, a third conductive portion 1513, a fourth conductive portion 1514, and/or a fifth conductive portion 1515, which may be split by the non-conductive portion 620.

According to another embodiment of the disclosure, by providing one or more extensions 1511b, 1512b, 1513b, 1514b, and 1515b having lengths extending toward the rotary shaft 811 for one or more of the first conductive portion 1511, the second conductive portion 1512, the third conductive portion 1513, the fourth conductive portion 1514, and/or the fifth conductive portion 1515, it is possible to increase the lengths of antennas or to adjust a length of a peripheral antenna.

According to another embodiment of the disclosure, the first conductive portion 1511 may include a first outer portion 1511a disposed in the outer edge area of the first flat portion (e.g., the first flat portion 220 of FIG. 8A) or the second flat portion (e.g., the second flat portion 230 of FIG. 8A) and a first extension 1511b extending from the first outer portion 1511a toward the rotary shaft 811. By providing a first feeding point 941-1 electrically connected to the feeding portion of the second PCB 822 (or the third PCB 823 in FIG. 8A) in the first outer portion 1511a, the first conductive portion 1511 may operate as a first antenna.

According to another embodiment of the disclosure, the second conductive portion 1512 may include a second outer portion 1512a disposed in the outer edge area of the first flat portion (e.g., the first flat portion 220 of FIG. 8A) or the second flat portion (e.g., the second flat portion 230 of FIG. 8A) and a second extension 1512b extending from the second outer portion 1512a toward the rotary shaft 811. By providing a second feeding point 941-2 electrically connected to the feeding portion of the second PCB 822 (or the third PCB 823 in FIG. 8A) in the second outer portion 1512a, the second conductive portion 1512 may operate as a second antenna.

According to another embodiment of the disclosure, the third conductive portion 1513 may include a third outer portion 1513a disposed in the outer edge area of the first flat portion (e.g., the first flat portion 220 of FIG. 8A) or the second flat portion (e.g., the second flat portion 230 of FIG. 8A) and a third extension 1513b extending from the third outer portion 1513a toward the rotary shaft 811. By providing a third feeding point 941-3 electrically connected to the feeding portion of the second PCB 822 (or the third PCB 823 in FIG. 8A) in the third outer portion 1513a, the third conductive portion 1513 may operate as a third antenna.

According to another embodiment of the disclosure, the fourth conductive portion 1514 may include a fourth outer portion 1514a disposed in the outer edge area of the first flat portion (e.g., the first flat portion 220 of FIG. 8A) or the second flat portion (e.g., the second flat portion 230 of FIG. 8A) and a fourth extension 1514b extending from the fourth outer portion 1514a toward the rotary shaft 811. By providing a fourth feeding point 941-4 electrically connected to the feeding portion of the second PCB 822 (or the third PCB 823 in FIG. 8A) and a ground point 942 electrically connected to a ground in the fourth outer portion 1514a, the fourth conductive portion 1514 may operate as a fourth antenna.

According to another embodiment of the disclosure, the fifth conductive portion 1515 may include a fifth outer portion 1515a disposed in the outer edge area of the first flat portion (e.g., the first flat portion 220 of FIG. 8A) or the second flat portion (e.g., the second flat portion 230 of FIG. 8A) and a fifth extension 1515b extending from the fifth outer portion 1515a toward the rotary shaft 811. By providing a switch portion 943 electrically connected to a switch of the second PCB 822 (or the third PCB 823 in FIG. 8A) in the fifth extension 1515b, the fifth conductive portion 1515 may provide an antenna tuning structure configured to adjust the length of a peripheral antenna.

Figure 16:
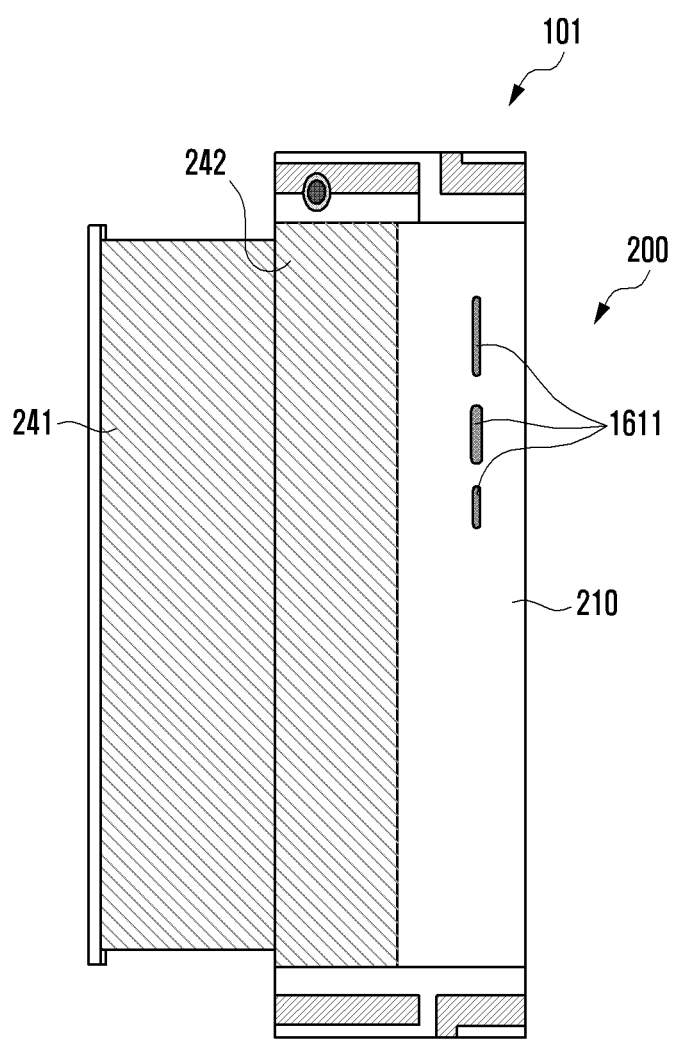
FIG. 16 is a plan view illustrating physical buttons of an electronic device according to an embodiment of the disclosure.

FIG. 16 is a plan view illustrating physical buttons of an electronic device according to an embodiment of the disclosure.

The electronic device 101 illustrated in FIG. 16 may include an embodiment that is at least partially similar to or different from the electronic device 101 illustrated in FIGS. 1 to 7, 8A, 8B, 9, 10, 11A, 11B, 12, 13, 14, and 15. Hereinafter, features of the electronic device 101 that have not been described with reference to FIGS. 1 to 7, 8A, 8B, 9, 10, 11A, 11B, 12, 13, 14, and 15 or are changed from FIGS. 1 7, 8A, 8B, 9, 10, 11A, 11B, 12, 13, 14, and to 15 will be mainly described with reference to FIG. 16.

Referring to FIG. 16, the electronic device 101 according to various embodiments may include one or more physical buttons 1611 visibly exposed through at least a portion of the housing 200, for example, at least a portion of the main body 210.

According to various embodiments of the disclosure, the one or more physical buttons 1611 may include at least one of a volume control button configured to adjust the volume of a speaker, a power button, a function button configured to control an artificial intelligence application, or a user custom button configured to provide a user custom function. In some embodiments of the disclosure, the electronic device 101 may be switched from the first state to the second state or from the second state to the first state by triggering the operation of a drive mechanism based on a user input made through the one or more physical buttons 1611.

Reference numeral 241, which has not been described in FIG. 16, may denote a first display (e.g., the first display 241 of FIG. 3).

Reference numeral 242, which has not been described in FIG. 16, may denote a second display (e.g., the second display 242 of FIG. 3).

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a housing comprising:
 a first flat portion disposed at one end of the housing, and
 a second flat portion disposed at another end of the housing and disposed in parallel to the first flat portion,
 wherein each of the first flat portion and the second flat portion comprises at least one conductive portion and at least one non-conductive portion;
a rotary shaft disposed in a first direction in an inner space of the housing;
a first printed circuit board (PCB) coupled to the rotary shaft and configured to rotate following rotation of the rotary shaft;
a rollable display arranged to be rolled in the inner space of the housing and pushed out from inside to outside of the housing in interlocking with the rotation of the rotary shaft in a second direction perpendicular to the first direction;
a first electrical component disposed between the first flat portion and one end of the rotary shaft in the inner space of the housing and fixed regardless of the rotation of the rotary shaft,
 wherein the first electrical component is operably connected to the at least one conductive portion of the first flat portion via a first connecting member; and
a first rollable flexible PCB (FPCB) electrically connecting the first PCB and the first electrical component to each other,
 wherein the first rollable FPCB is spirally rolled around the one end of the rotary shaft.

2. The electronic device of claim 1,
wherein one end of the first rollable FPCB is disposed adjacent to the one end of the rotary shaft and is electrically connected to a portion of the first PCB, and
wherein another end of the first rollable FPCB is electrically connected to a portion of the first electrical component.

3. The electronic device of claim 1,
wherein the first electrical component comprises a circular first opening in a center thereof, and
wherein the first rollable FPCB has a diameter smaller than or equal to a diameter of the circular first opening.

4. The electronic device of claim 1,
wherein a first shield member is disposed between the first rollable FPCB and the first PCB, and
wherein the first rollable FPCB is configured to form a radiation pattern in a direction from the first shield member toward the first flat portion by comprising at least one wire configured to provide a wireless charging function.

5. The electronic device of claim 1,
wherein the housing is configured in a hollow shape which comprises one of a cylindrical shape or a prismatic shape, and
wherein the rollable display is accommodated in the inner space of the housing in a rolled state.

6. The electronic device of claim 1, further comprising:
a second electrical component disposed between the second flat portion and another end of the rotary shaft in the inner space of the housing and fixed regardless of the rotation of the rotary shaft,
wherein the second electrical component is operably connected to the at least one conductive portion of the second flat portion via a second connecting member; and
a second rollable FPCB electrically connecting the first PCB and the second electrical component to each other,
wherein the second rollable FPCB is spirally rolled around the other end of the rotary shaft.

7. The electronic device of claim 6,
wherein one end of the second rollable FPCB is disposed adjacent to the other end of the rotary shaft and is electrically connected to a portion of the first PCB, and
wherein the other end of the second rollable FPCB is electrically connected to a portion of the second electrical component.

8. The electronic device of claim 6,
wherein the first PCB comprises a circular second opening in a center thereof, and
wherein the second rollable FPCB has a diameter smaller than or equal to a diameter of the circular second opening.

9. The electronic device of claim 6, wherein a second shield member is disposed between the second rollable FPCB and the first PCB.

10. The electronic device of claim 9, wherein the second rollable FPCB comprises at least one wire configured to provide a wireless charging function, thereby forming a radiation pattern in a direction from the second shield member toward the second flat portion.

11. The electronic device of claim 1, further comprising a plurality of guide wheels spirally disposed along a surface of the first rollable PCB at intervals,
wherein each of the plurality of guide wheels comprises:
a wheel member that comes into contact with the surface of the first rollable PCB; and
a guide shaft penetrating the wheel member.

12. The electronic device of claim 11, further comprising a plurality of rail members configured to guide movement of the plurality of guide wheels,
wherein the plurality of rail members are provided to be directed toward a center of the rotary shaft to enable the plurality of guide wheels to reciprocate toward the center of the rotary shaft.

13. The electronic device of claim 12, wherein the plurality of rail members comprises:
at least one first rail member provided on the first flat portion; and
a second rail member provided on a first shield member disposed between the first rollable FPCB and the first PCB.

14. The electronic device of claim 1, wherein the at least one conductive portion comprises:
a first conductive portion;
a second conductive portion; and
a third conductive portion disposed at intervals along an outer edge of the first flat portion to be split by the non-conductive portion.

15. The electronic device of claim 14,
wherein the first conductive portion is configured to operate as a first antenna by comprising a first feeding point electrically connected to a feeding portion of the first electrical component and a first ground point electrically connected to a ground,
wherein the second conductive portion is configured to operate as a second antenna by comprising a second feeding point electrically connected to the feeding portion of the first electrical component and a second ground point electrically connected to the ground, and
wherein the third conductive portion is configured to operate as a third antenna by comprising a third feeding point electrically connected to the feeding portion of the first electrical component and a switch portion electrically connected to a switch of the first electrical component.

* * * * *